(12) United States Patent
Srinivasan et al.

(10) Patent No.: US 7,924,589 B1
(45) Date of Patent: Apr. 12, 2011

(54) ROW REDUNDANCY FOR CONTENT ADDRESSABLE MEMORY HAVING PROGRAMMABLE INTERCONNECT STRUCTURE

(75) Inventors: Varadarajan Srinivasan, Los Altos Hills, CA (US); Sandeep Khanna, Los Altos, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 182 days.

(21) Appl. No.: 12/352,528

(22) Filed: Jan. 12, 2009

Related U.S. Application Data

(63) Continuation-in-part of application No. 12/131,992, filed on Jun. 3, 2008, now Pat. No. 7,643,353.

(51) Int. Cl.
G11C 15/00 (2006.01)
G11C 29/00 (2006.01)

(52) U.S. Cl. .................... 365/49.17; 365/200; 714/54

(58) Field of Classification Search ............. None
See application file for complete search history.

(56) References Cited

U.S. PATENT DOCUMENTS

| | | | |
|---|---|---|---|
| 5,278,981 A | 1/1994 | Kawaguchi et al. | |
| 5,440,715 A | 8/1995 | Wyland | |
| 5,452,451 A | 9/1995 | Akizawa et al. | |
| 5,497,488 A | 3/1996 | Akizawa et al. | |
| 5,712,971 A | 1/1998 | Stanfill et al. | |
| 6,246,601 B1 | 6/2001 | Pereira | |
| 6,249,467 B1 | 6/2001 | Pereira et al. | |
| 6,252,789 B1 | 6/2001 | Pereira et al. | |
| 6,275,426 B1 | 8/2001 | Srinivasan et al. | |
| 6,560,670 B1 | 5/2003 | Ichiriu | |
| 6,751,755 B1 * | 6/2004 | Sywyk et al. ............. | 714/54 |
| 6,785,677 B1 | 8/2004 | Fritchman | |
| 6,865,098 B1 | 3/2005 | Ichiriu et al. | |
| 6,892,237 B1 | 5/2005 | Gai et al. | |
| 7,134,143 B2 | 11/2006 | Stellenberg et al. | |
| 7,225,188 B1 | 5/2007 | Gai et al. | |
| 7,353,332 B2 | 4/2008 | Miller et al. | |
| 7,643,353 B1 | 1/2010 | Srinivasan et al. ......... | 365/49.17 |
| 7,656,716 B1 | 2/2010 | Srinivasan et al. ......... | 365/49.17 |
| 7,660,140 B1 | 2/2010 | Joshi et al. ................. | 365/49.17 |
| 2004/0177319 A1 | 9/2004 | Horn | |
| 2006/0215432 A1* | 9/2006 | Wickeraad et al. ............. | 365/49 |
| 2010/0054012 A1 | 3/2010 | Srinivasan et al. ......... | 365/49.17 |
| 2010/0054013 A1 | 3/2010 | Joshi et al. ................. | 365/49.17 |

OTHER PUBLICATIONS

A versatile Data String-Search VLSI; Hirata et al.; IEEE Journal of Solid-State Circuits, vol. 23, No. 2, Apr. 1988, 7 pgs.
Efficient String Matching: An Aid to Bibliographic Search; Programming Techniques; A. Aho and M. Corasick; Bell Laboratories; 1975, 8 pgs.
Fast Routing Table Lookup Using CAMs; McAuley et al.; Morristown, NJ, USA; 1993; 10 pgs.
Gigabit Rate Packet Pattern-Matching Using TCAM; Fang Yu, Randy Katcz EECS Dept. UC Berkeley, T.V. Lakshman, Bell Laboratories; date at least earlier than Jun. 3, 2008; 10 pgs.
High Speed Pattern Matching for Network IDS/IPS; Alicherry et al.; Lucent Bell Laboratories; IEEE, 2006, 10 pgs.
Small Forwarding Tables for Fast Routing Lookups; Degermark et al.; Lulea University of Technology; Lulea, Sweden; 1997; 12 pgs.

* cited by examiner

*Primary Examiner* — Hoai V Ho
*Assistant Examiner* — James G Norman
(74) *Attorney, Agent, or Firm* — Mahamedi Paradice Kreisman LLP; William L. Paradice, III

(57) ABSTRACT

A content addressable memory (CAM) device includes an array having a number N of CAM rows, each row including a plurality of CAM cells coupled to a match line, a spare CAM row including a plurality of CAM cells coupled to a spare match line, and row replacement circuitry configured to functionally replace a defective CAM row and each subsequent CAM row in the array with corresponding next adjacent CAM rows, wherein a last CAM row in the array is functionally replaced by the spare CAM row.

19 Claims, 15 Drawing Sheets

ROW REDUNDANCY FOR CONTENT ADDRESSABLE MEMORY HAVING PROGRAMMABLE INTERCONNECT STRUCTURE

CROSS-REFERENCE TO RELATED APPLICATIONS

This application is a continuation-in-part, and claims the benefit under 35 USC 120, of the commonly owned U.S. patent application Ser. No. 12/131,992 entitled "Content Addressable Memory Device Having Programmable Interconnect Structure" filed on Jun. 3, 2008 now U.S. Pat. No. 7,643,353, which is incorporated by reference herein.

TECHNICAL FIELD

The present invention relates to row redundancy in a CAM device.

BACKGROUND OF RELATED ART

Regular expression search operations are employed in various applications including, for example, intrusion detection systems (IDS), virus protections, policy-based routing functions, Internet and text search operations, document comparisons, and so on. A regular expression can simply be a word, a phrase or a string of characters. For example, a regular expression including the string "gauss" would match data containing gauss, gaussian, degauss, etc. More complex regular expressions include metacharacters that provide certain rules for performing the match. Some common metacharacters are the wildcard ".", the alternation symbol "|", and the character class symbol "[ ]." Regular expressions can also include quantifiers such as "*" to match 0 or more times, "+" to match 1 or more times, "?" to match 0 or 1 times, {n} to match exactly n times, {n,} to match at least n times, and {n,m} to match at least n times but no more than m times. For example, the regular expression "a.{2}b" will match any input string that includes the character "a" followed exactly 2 instances of any character followed by the character "b." Matching input strings for the regular expression "a.{2}b" include, for example, the input strings "abbb," adgb," "a7yb," and "aaab."

Traditionally, regular expression searches have been performed using software programs executed by one or more processors, for example, associated with a network search engine. However, as both the number and complexity of regular expressions increase for applications such as intrusion detection systems using access control lists, software solutions are less able to achieve desired search speeds and throughput. As a result, hardware solutions such as ternary content addressable memory (TCAM) based search engines are being developed that can implement and perform regular expression search operations at faster speeds than software solutions typically allow.

A typical CAM device includes a plurality of rows of CAM cells, each for storing a single data word. During compare operations, a search key is provided to the CAM device and is simultaneously compared with all the words stored therein to determine whether there is a match condition. If there are one or more matches, a priority encoder generates the index of the highest priority matching entry. Because the CAM entries are searched in parallel, search speed is not dependent upon the number of words stored in the CAM device. However, because the rows of a traditional CAM device cannot be connected together, the length of the data words stored therein is typically limited by the number of CAM cells in each row.

U.S. Pat. No. 6,252,789 discloses an inter-row configurable CAM device that includes a word expansion logic (WEL) circuit in each row of CAM cells. The WEL controls whether one or more consecutive rows of CAM cells are sequentially connected in a chain to form a data word chain that spans across multiple rows of the CAM array. More specifically, the WELs in all CAM rows that store the data words of the chain are configured to logically combine (e.g., AND) the match signals of the current CAM row and the previous adjacent CAM row and to forward the combined match signals to the next adjacent CAM row, and the WEL in the CAM row that stores the last data word outputs the match signals to the priority encoder. In this manner, the CAM device of the '789 can be configured to perform string match operations on words having very large lengths.

Unfortunately, because match signals from a CAM row in the '789 patent can be routed to only one adjacent row at a time, regular expressions must be unrolled for storage in the CAM device of the '789 patent. For example, to store the regular expression REG1="ab(cd|ef|gh)uv" in the '789 CAM device, the REG1 are first unrolled to generate all possible matching strings (S1="abcduv," S2="abefuv," and S3="abghuv"), and then the individual strings must be stored separately as 3 data word chains in 3 corresponding sets of contiguous CAM rows. Thus, for example, if each CAM row includes 8 CAM cells to store an 8-bit ASCII encoded character, then a first set of 6 contiguous CAM rows of the '789 patent are required to store S1="abcduv," a second set of 6 contiguous CAM rows are required to store S2="abefuv," and a third set of 6 contiguous CAM rows are required to store S3="abghuv," thereby requiring 18 contiguous rows in the '789 patent to store a regular expression that, in its original (e.g., rolled) form, includes only 10 characters.

The above-referenced co-pending and commonly owned U.S. patent application Ser. No. 12/131,922 (hereinafter referred to as the '922 application) discloses a TCAM-based search engine that can not only store regular expressions in their original or rolled form but also store complex regular expressions having various metacharacters, quantifiers, and/or character classes. More specifically, the TCAM device disclosed in the '922 application includes an array containing a plurality of rows of CAM cells each selectively connected to a programmable interconnect structure (PRS) that can be configured to selectively route the match signal from each CAM row as an input match signal to itself and/or to any number of other arbitrary selected CAM rows at the same time. The TCAM device also includes a number of counter circuits that can be selectively coupled to each other and/or to any number of the CAM rows by the PRS, which can be programmed to selectively route match signals from one or more CAM rows to the inputs of the counter circuits and to route the counter output signals as input match signals to one or more arbitrary selected CAM rows at the same time.

Row redundancy has been used to improve the yield of CAM devices. For example, U.S. Pat. No. 6,249,467 discloses a CAM device having a main array of CAM rows and a separate spare CAM row that can be selected to functionally replace a defective CAM row in the main CAM array by disabling the defective CAM row, enabling the spare CAM row, and mapping the address of the disabled defective CAM row to the enabled spare CAM row. However, because the spare CAM row is typically positioned below the main CAM array and is mapped directly to the disabled defective CAM row in the main array, the prior row redundancy technique disclosed in the '467 patent is not well suited for the PRS-equipped CAM device disclosed in the '922 application.

More specifically, because the CAM rows of the PRS-equipped CAM device are selectively interconnected by the PRS to form a match signal routing pattern that embodies the metacharacters and/or quantifiers of regular expressions to be stored therein, functionally replacing a defective CAM row with a spare CAM row using the prior row redundancy disclosed in the '467 patent requires re-routing the match signal connections associated with the defective CAM row to the spare CAM row using the PRS, which may not have sufficient resources for re-routing the match signal connections if the defective CAM row is not adjacent to the spare CAM row. For example, if there are a number I of intermediate CAM rows positioned between the defective CAM row and the spare CAM row, then functionally replacing the defective CAM row with the spare CAM row using such prior row redundancy techniques involves allocating PRS routing resources to re-route the match signal connections associated with the defective CAM row across the number I of intermediate CAM rows to the spare CAM row, which in turn reduces the amount of PRS resources available to implement the regular expressions.

Thus, to ensure that any defective CAM row in the array can be functionally replaced by the spare CAM row using techniques of the type described in the '467 patent, the PRS would need long signal lines extending across the entire array and the spare row (e.g., global PRS signal lines) and dedicated for row replacement operations. Unfortunately, providing global PRS signal lines dedicated for row redundancy consumes valuable circuit area that could otherwise be used to implement the signal routing pattern (e.g., between non-defective CAM rows) that embodies the regular expressions to be stored therein. Further, global PRS signal lines extending across the array that enable the match signal connections associated with any CAM row to be re-routed to the spare CAM row would have large parasitic capacitances (e.g., as compared to shorter PRS routing lines that extend across only several CAM rows), which degrades performance.

Thus, there is a need for a row redundancy scheme for a PRS-equipped CAM device that does not require dedicated PRS signal lines that extend between the spare CAM row and all main CAM rows of the array.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

A row redundancy scheme for a PRS-equipped CAM device is disclosed. In accordance with present embodiments, the CAM device includes a CAM array having a plurality of main CAM rows, a spare CAM row, and a programmable interconnect structure (PRS) that can be selectively configured to implement a row redundancy scheme without global PRS signal lines extending between the spare CAM row and all the main CAM rows. For some embodiments, each CAM row positioned below (e.g., having a higher physical address than) the defective CAM row is re-assigned (e.g., re-mapped) to functionally replace the corresponding previous CAM row, and the spare CAM row is re-assigned to functionally replace the last main CAM row. More specifically, if there is a defective CAM row, the spare CAM row is enabled, and the PRS is configured to re-route the match signal connections associated with the defective CAM row to an adjacent CAM row, to re-route the match signal connections associated with the adjacent CAM row to a next adjacent CAM row, and so on, where the match signal connections associated with last CAM row are re-routed to the spare CAM row. In this manner, the PRS can facilitate the functional replacement of the defective CAM row using sets of short PRS signal lines (e.g., that extend only between corresponding pairs of adjacent CAM rows).

For some embodiments, the CAM array includes or is divided into a plurality of CAM blocks, each including a number of main CAM rows. If a CAM block is identified as having a defective CAM row, the defective CAM row is disabled, a CAM row in a next adjacent CAM block is re-assigned to the identified CAM block (e.g., to functionally replace the defective CAM row), and thereafter a CAM row in each subsequent CAM block is re-assigned to the corresponding previous CAM block, with the spare CAM row enabled and re-assigned to the last CAM block in the array. In this manner, a CAM row from each CAM block below the identified CAM block is re-mapped to the corresponding previous CAM block, thereby rippling the spare CAM row through the array to replace the defective CAM row without requiring a direct PRS connection between the defective CAM row and the spare CAM row.

Figure 1:
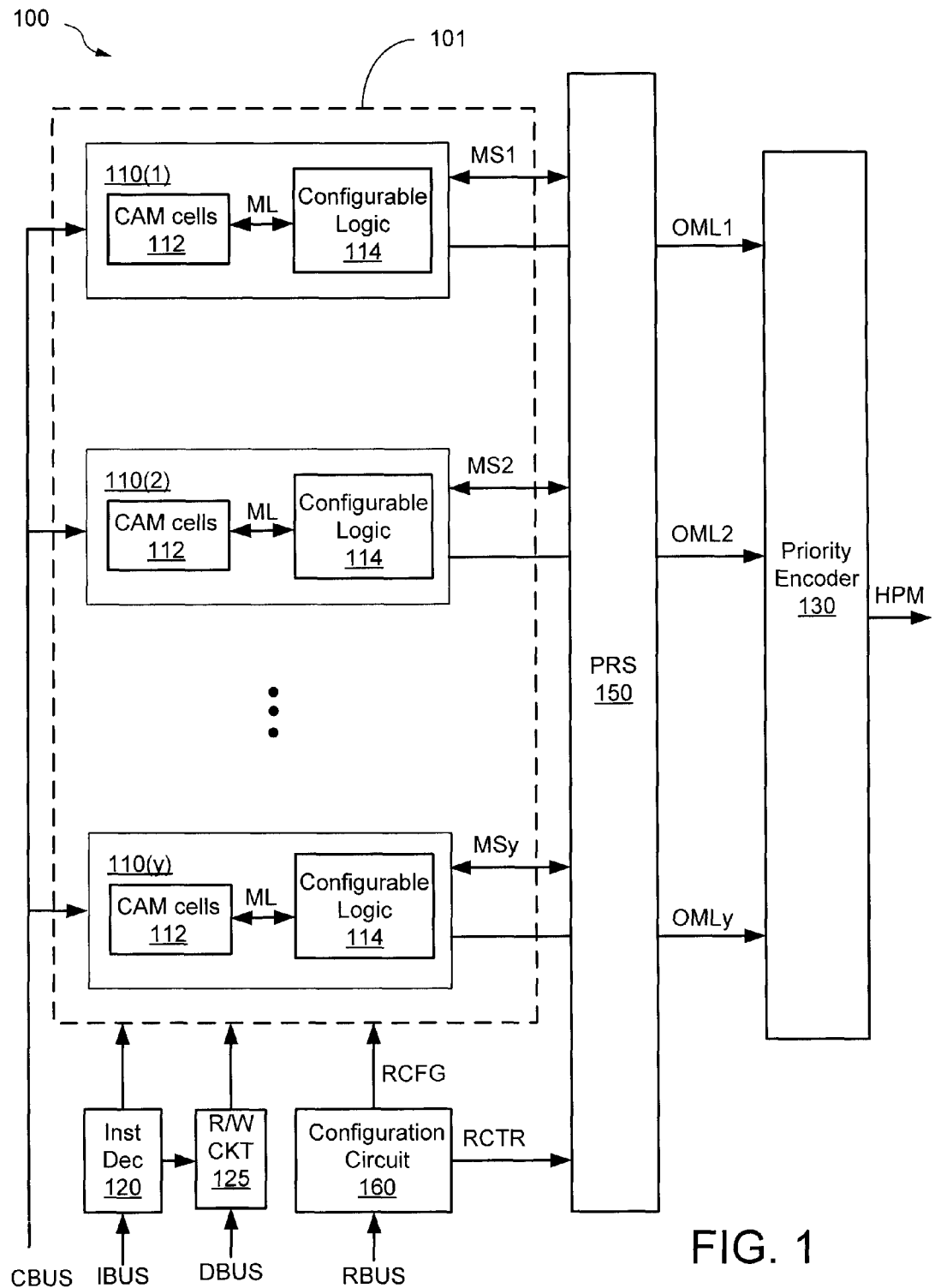
FIG. 1 shows a simplified block diagram of a content addressable memory (CAM) device having an array of CAM cells coupled to a programmable interconnect structure (PRS)

FIG. 1 is a functional block diagram of a CAM device 100 disclosed in the above-referenced U.S. patent application Ser. No. 12/131,992. CAM device 100 includes a CAM array 101, an instruction decoder 120, a read/write circuit 125, a priority encoder 130, a programmable interconnect structure (PRS) 150, and a configuration circuit 160. Other well-known components and control signals, for example, such as an address decoder, comparand register, and clock signals, are not shown for simplicity.

CAM array 101 includes a plurality of rows 110(1)-110(y), each having a number of CAM cells 112 and a configurable logic circuit 114. Each CAM row 110 is coupled to a comparand bus CBUS via a well-known comparand register (not shown for simplicity), and is coupled to the PRS 150 via match signal (MS) lines and to the priority encoder 130 via output match lines (OML). CAM cells 112 can be any suitable type of CAM cells including, for example, binary CAM cells, ternary CAM cells, and/or quaternary CAM cells. For each CAM row 110, the CAM cells 112 are coupled to the configurable logic circuit 114 via match lines, which can provide match signals from CAM cells 112 to configurable logic circuit 114, and for some embodiments can also provide match signals from configurable logic circuit 114 as enable signals to CAM cells 112. The configurable logic circuits 114 can be programmed or configured using row configuration data (RCFG) to selectively route match signals to priority encoder 130 via the output match lines (OML), to route the match signals to the PRS 150 via the MS lines, and/or to selectively combine the row match signals with match signals from one or more other CAM rows provided on the MS lines by the PRS 150.

Priority encoder 130, which is well-known, has inputs coupled to the output match lines (OML) from the CAM rows 110, and has an output to generate the index of the highest priority matching CAM row 110 (e.g., the HPM index). Although not shown for simplicity, each row of CAM cells 112 can include a validity bit (V-bit) that indicates whether valid data is stored in the CAM row, and the V-bits can be provided by the priority encoder 130 to determine the next free address in the CAM array for storing new data.

Instruction decoder 120 decodes instructions provided on the instruction bus IBUS, and provides control signals to CAM cells 112 and to read/write circuit 125 that control read, write, and compare operations in CAM array 101. For other embodiments, instruction decoder 120 can decode the instructions and provide configuration information to configurable logic circuits 114.

Read/write circuit 125, which is well-known, controls read and write operations for CAM array 101. For example, during write operations, data is provided to read/write circuit 125 via a data bus (DBUS), or alternately from CBUS, and in response to control signals provided by instruction decoder 120, read/write circuit 125 writes the data into the CAM cells 112 of the row or rows selected for the write operation. During read operations, data is output in a well-known manner from one or more selected CAM rows 110 to read/write circuit 125, which in turn provides the data onto DBUS.

The PRS 150 includes a plurality of signal routing lines (not shown individually in FIG. 1 for simplicity) extending across the rows 110 of CAM cells 112 and programmably connected to the match signal (MS) lines in each CAM row 110 in response to routing control signals (RCTR). As explained in more detail below, the RCTR signals control the configuration of a plurality of programmable switch matrixes (not shown in FIG. 1 for simplicity) that selectively connect the MS lines of the various CAM rows 110 to the signal routing lines within the PRS 150. The PRS 150 can be implemented using any suitable switch circuits and/or logic (e.g., switch matrices, crossbar circuits, programmable switches, and so on) that selectively routes the row match signals from each CAM row to any number of arbitrarily selected CAM rows (e.g., regardless of whether the selected CAM rows are adjacent to one another) at the same time.

Configuration circuit 160 includes an input coupled to a regular expression bus (RBUS), first outputs coupled to CAM array 101, and second outputs coupled to the PRS 150. For some embodiments, configuration information (e.g., which can embody one or more regular expressions) can be provided to configuration circuit 160 via RBUS, and in response thereto configuration circuit 160 provides the row configuration information (RCFG) to configurable logic circuits 114 and provides the routing control signals (RCTR) to the PRS 150. For one embodiment, configuration circuit 160 includes a configuration memory (not shown for simplicity in FIG. 1) for storing RCFG and RCTR information received from RBUS. Together, the RCFG and RCTR information form configuration data that can be used to program the CAM device 100 to implement search operations for one or more regular expressions, as described below.

For other embodiments, RCFG can be provided to row configurable logic circuits 114 using other techniques. For example, for another embodiment, RCFG can be provided to configurable logic circuits 114 using the instruction decoder 120 and/or stored in memory elements (not shown for simplicity) within the CAM rows 110. Similarly, for other embodiments, the RCTR signals can be provided to the PRS 150 using other techniques. For example, for another embodiment, the RCTR signals can be provided to the PRS using the instruction decoder 120 and/or stored in memory elements (not shown for simplicity) within the PRS 150.

The PRS 150 can be selectively configured to route the match signals from any CAM row 110 as an input match signal to any number of other arbitrarily selected or located CAM rows 110 at the same time, regardless of whether the other selected CAM rows are contiguous with one another. Further, for some embodiments, the PRS 150 can be configured to route match signals from one CAM row as the input match signal to the same row. The input match signals can be used as row enable or trigger signals to selectively enable the CAM rows for subsequent compare operations, and can therefore be used to logically connect a number of arbitrarily selected CAM rows together. As described below, CAM devices employing CAM arrays configured in accordance with present embodiments provide numerous functional and performance advantages over conventional CAM devices.

First, because the PRS 150 can route the match signals from any CAM row 110 in CAM array 101 to any number of arbitrarily selected CAM rows 110 in the array 101, a data word chain spanning a multiple number N of CAM rows can be stored in any available N CAM rows 110 of CAM array 101, even if none of the available CAM rows are contiguous or adjacent to each other, by configuring the PRS 150 to logically connect the available CAM rows together to form a data word chain. Thus, for example, if CAM array 101 of FIG. 1 includes 5 available but non-contiguous CAM rows 110, then the PRS 150 can be programmed to logically connect the 5 available CAM rows 110 into a chain that can store a data word chain spanning 5 CAM rows. In contrast, to store a new 5 data word chain in a prior CAM device such as disclosed in U.S. Pat. No. 6,252,789, a block of 5 available and contiguous CAM rows are needed. Thus, if there are 5 available but non-contiguous CAM rows in the CAM device of the '789 patent, the new 5 data word chain can be stored therein only if the existing contents of the CAM array are re-arranged to create a block of 5 available contiguous CAM rows, which undesirably requires burdensome and time-consuming table management tools.

Second, by allowing match signals from one CAM row to be routed to any number of selected CAM rows (e.g., including the same CAM row) as input match signals at the same time, CAM device 100 can store regular expressions using significantly fewer numbers of CAM rows than conventional CAM devices such as those disclosed in the '789 patent. More specifically, because the PRS 150 can simultaneously and independently route the match signals from any CAM row 110 to any number of other CAM rows 110 at the same time, embodiments of CAM device 100 can store a regular expression in its rolled format (e.g., its original form), for example, because each common portion of all the different strings that can match the regular expression can be stored in a corresponding single location (e.g., in one CAM row or one group of CAM rows), and their match signals can be simultaneously routed to multiple other locations that store other non-common portions of the possible matching strings. In contrast, storing a regular expression in CAM devices such as those disclosed in the '789 patent requires unrolling the regular expression to generate all possible matching strings of the regular expression, and then storing each of the possible matching strings in a corresponding group of contiguous CAM rows, as described above.

In addition, the ability to route a CAM row's output match signal as an input signal to itself and/or any number of other CAM rows at the same time allows embodiments of CAM device 100 to implement complex regular expressions having metacharacters such as ".", "+", and {m,n}, as described in more detail in the '992 application.

Figure 2:
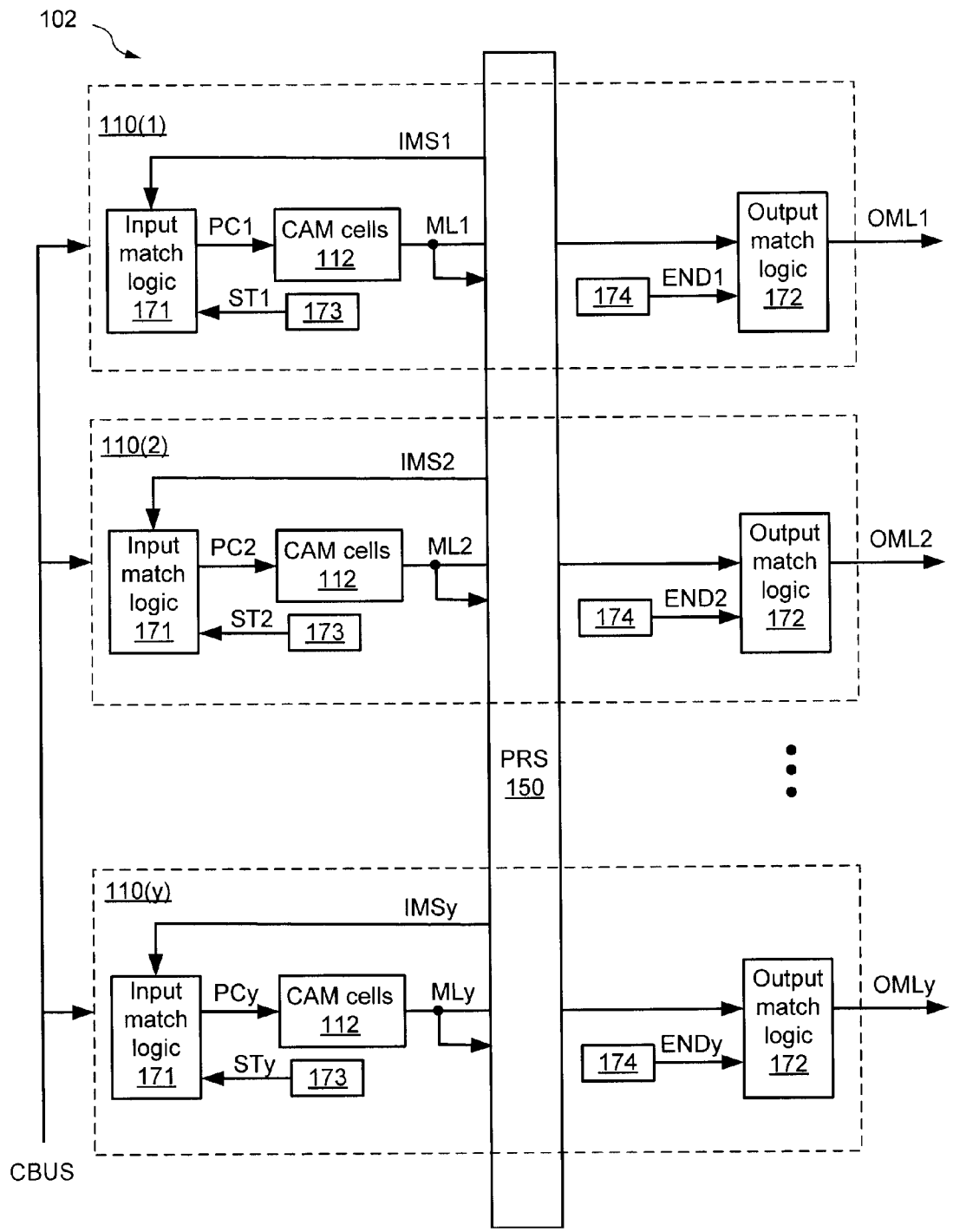
FIG. 2 shows a simplified block diagram of one embodiment of the CAM array of FIG. 1.

FIG. 2 shows a CAM array 102 that is one embodiment of CAM array 101 of FIG. 1. For the exemplary embodiment of FIG. 2, each CAM row 110 includes a number of CAM cells 112, input match logic 171, output match logic 172, and configuration memory cells 173-174. Each CAM row is selectively connected to the PRS 150, which as described above can route match signals from any CAM row to one or more arbitrarily selected CAM rows at the same time. Within each CAM row 110, the input match logic 171 includes a data input to receive match signals from the same or a number of other CAM rows 110 via the input match signal (IMS) lines, a control input to receive a start bit (ST) from configuration memory cell 173, and an output to provide a pre-charge signal PC to the CAM cells 112. Output match logic 172 includes a data input to receive match signals from the CAM cells 112 via the match lines ML during compare operations with input data, a control input to receive an end bit (END) from configuration memory cell 174, and an output coupled to priority encoder 130 (not shown for simplicity in FIG. 2) via the output match line OML. Together, input match logic 171 and output match logic 172 form one embodiment of the configurable logic circuit 114 of FIG. 1.

The configuration memory cells 173-174 can be any suitable type of memory cells including, for example, an SRAM or DRAM cells, EEPROM cells, flash memory cells, fuses, and so on. Further, although depicted in FIG. 2 as being separate memory elements associated with corresponding CAM rows 110, for other embodiments, the memory cells 173-174 can be formed as an addressable array of configuration memory cells.

The start (ST) and end (END) bits for each row 110 in FIG. 2, which together represent the row configuration information (RCFG) for a corresponding CAM row of FIG. 1, control the logical operations and routing functions of the input match logic 171 and the output match logic 172, respectively, of the CAM row during compare operations. More specifically, the start bit (ST) indicates whether the data word stored in the corresponding CAM row is the first data word of a data word chain, and the end bit (END) indicates whether the data word stored in the corresponding CAM row is the last data word of a data word chain. The start bit and end bit can be further encoded, as shown below in Table 1, to indicate that the corresponding data word is a continuing data word or a default data word, where a continuing data word is an intermediate data word between the first and last data words in a data word chain that spans multiple CAM rows, and a default data word corresponds to a data word chain that has only one data word (and thus spans only one CAM row 110).

TABLE 1

| ST | END | Function |
|----|-----|----------|
| 0  | 0   | continuing word |
| 0  | 1   | last word |
| 1  | 0   | first word |
| 1  | 1   | default word |

For some embodiments of CAM array 102 of FIG. 2, if the start bit ST of a row 110 is asserted, which indicates that the CAM row 110 stores the first data word in a chain, the asserted state of ST causes input match logic 171 to ignore any input match signals (e.g., received from the PRS 150 via the IMS line) and allows the match signal generated in response to a comparison between input data (e.g., an input character of the input string) and the data stored in the row's CAM cells 112 to be propagated as the output match signal for the row on the match line ML. Conversely, if ST of the row 110 is de-asserted, which indicates that the CAM row stores either an intermediate word or the last word in the data word chain, the de-asserted state of ST causes the row's input match circuit 171 to selectively enable compare operations between the input character and data stored in the row's CAM cells 112 in response to the input match signals received from the same and/or one or more other arbitrarily selected CAM rows (e.g. received from the PRS 150) to generate an output signal for the CAM row.

Further, if the end bit END of the CAM row 110 is asserted, which indicates that CAM row 110 stores the last data word in the chain, the asserted state of END causes the row's output match logic 172 to pass the row's match signal on its match line ML to the priority encoder 130 via its OML line. Conversely, if END for the CAM row 110 is de-asserted, which indicates that CAM row 110 does not store the last data word in the data word chain, the de-asserted state of END prevents the row's output match logic 172 from passing the row's match signal on ML to the priority encoder 130. The logic functions and output results provided by the CAM rows of FIG. 2 are summarized below in Table 2, where CMP indicates the results of a compare operation between an input character and data stored in the CAM cells 112 of the CAM row 110 and "*" indicates the logical AND function.

TABLE 2

| ST | END | ML | OML |
|----|-----|-----|-----|
| 0 | 0 | IMS*CMP | 0 |
| 0 | 1 | IMS*CMP | IMS*CMP |
| 1 | 0 | CMP | 0 |
| 1 | 1 | CMP | CMP |

Thus, as described above, during search operations, input match logic 171 selectively enables CAM cells 112 for compare operations in response to ST and the input match signals provided on the IMS lines, and output match logic 172 selectively provides the row match signals from CAM cells 112 on ML to the priority encoder 130 via OML in response to END. As explained in more detail below, by selectively enabling the CAM row 110 in response to the IMS signals during compare operations, input match logic 171 can not only combine match signals from multiple CAM rows but can also minimize power consumption by pre-charging the match lines ML of only those CAM rows 110 that need to participate in a given compare operation while disabling all other CAM rows (e.g., that do not need to participate in the given compare operation.

Although not shown in FIGS. 1 and 2 for simplicity, the array of CAM device 100 can include one or more sequencing logic circuits that each can be selectively coupled to any number of arbitrarily located sequencing circuits and/or RCAM rows via the PRS 150 to maintain independent counts of matches between input characters and one or more character classes, which as described in the '992 application, allows the CAM device 100 to handle regular expressions having one or more quantified character classes.

Figure 3A:
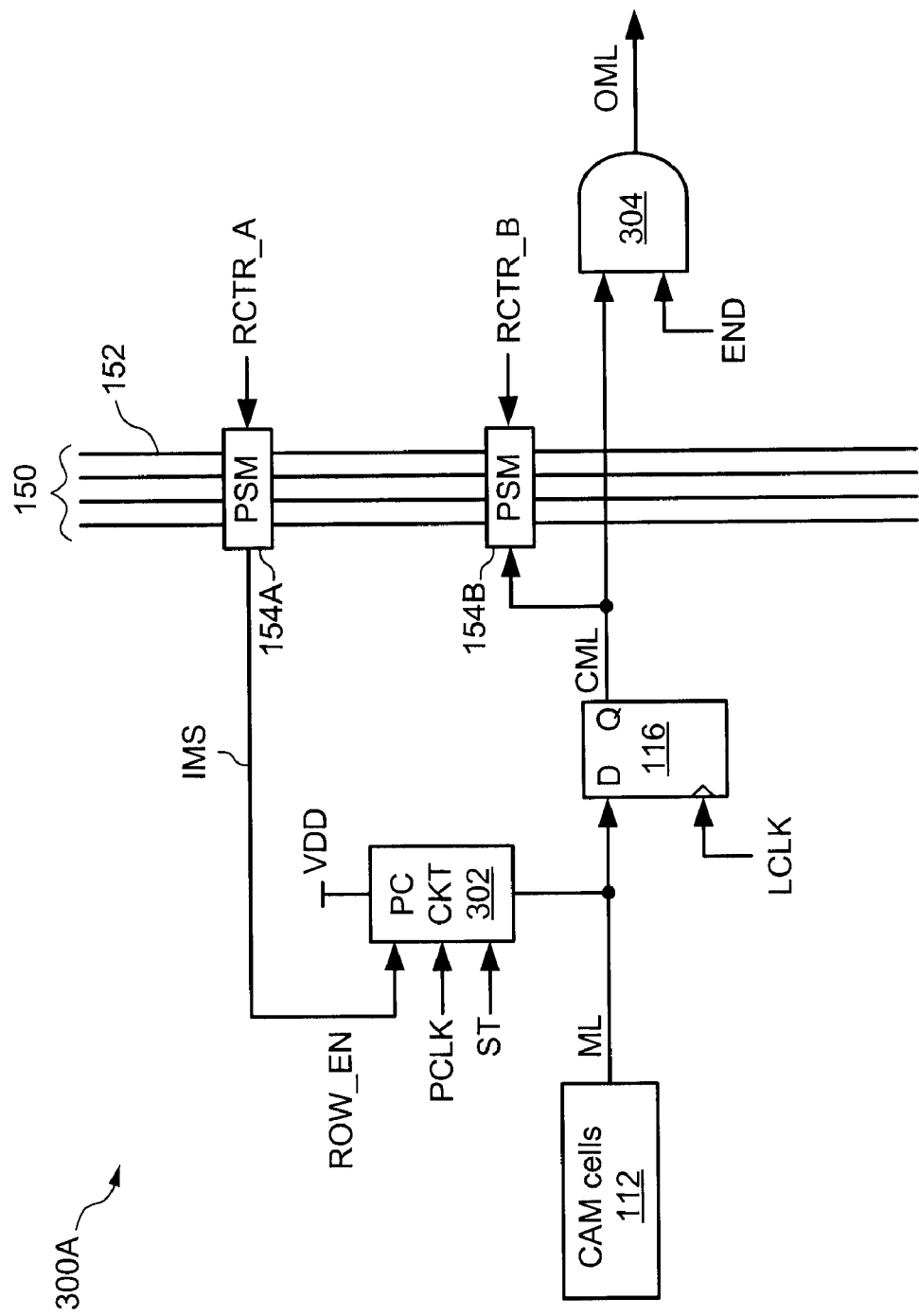
FIG. 3A shows a block diagram of one embodiment of the CAM rows of the CAM array of FIG. 2.

FIG. 3A shows a CAM row 300A that is one embodiment of CAM row 110 of CAM array 101 of FIG. 2. CAM row 300A, which includes a number of CAM cells 112, a match signal latch 116, a match line pre-charge circuit (PC CKT) 302, and an AND gate 304, is selectively connected to PRS 150 via programmable switch matrixes (PSM) 154A-154B. CAM cells 112, which can be any suitable CAM cell for storing a data word and comparing the data word with a search key, can include binary CAM cells, ternary CAM cells, and/or quaternary CAM cells. CAM cells 112 receive a search key or comparand word from the comparand bus CBUS (not shown for simplicity in FIG. 3A), and are coupled to match line ML.

Latch 116 includes a data input (D) coupled to ML, a clock input "<" to receive a latch clock signal (LCLK), and an output (Q) to provide clocked match signals on the clocked match line (CML) in response to LCLK. Latch 116, which can be any suitable latch or register circuit, latches the current match signals from CAM cells 112 onto CML. Although not shown for simplicity in FIG. 3A, latch 116 also includes a terminal coupled to ground potential (VSS). The CML line is coupled to AND gate 304, and is also selectively connected to the signal routing lines 152 of PRS 150 via PSM 154B. AND gate 304 also includes a second input to receive the END bit for the row, and includes an output to provide the row output match signals to priority encoder 130 via the OML line. Thus, AND gate 304, which selectively forwards the match signal on CML to priority encoder 130 in response to END, is one embodiment of output match logic 172 of FIG. 2. Accordingly, if END is asserted (e.g., to logic high), AND gate 304 forwards to the match signals on CML to the priority encoder 130 via OML. Conversely, if END is de-asserted (e.g., to logic low), then AND gate 304 does not forward the match signals on CML to the priority encoder 130.

Match line pre-charge circuit 302 has a first power terminal coupled to VDD, a second power terminal coupled to ML, a first input to receive ST for the row, a second input to receive a pre-charge clock signal PCLK, and a third input to selectively receive match signals from another CAM row via PRS 150 on the IMS line as a row enable signal (ROW_EN). Match line pre-charge circuit 302, which is one embodiment of input match logic 171 of FIG. 2, can be any suitable circuit that selectively pre-charges ML upon assertion of PCLK in response to ROW_EN and ST, as explained in more detail below. Together, match line pre-charge circuit 302 and AND gate 304 of CAM row 300 form another embodiment of configurable logic circuit 114 of FIG. 1.

PRS 150 is shown in FIG. 3A to include four signal routing lines 152 that can be selectively connected to the row's IMS lines via PSM 154A and/or to the row's CML line via PSM 154B. PSM 154A includes a control terminal to receive RCTR_A, which controls which signal routing lines 152 of the PRS 150 are connected to which (if any) IMS lines of row 300. PSM 154B includes a control terminal to receive RCTR_B, which controls which signal routing lines 152 are connected to the CML line of row 300A. Thus, the routing control signals RCTR_A and RCTR_B, which can be stored in the configuration circuit 160 (see also FIG. 1) or provided by the instruction decoder 120, control which match signals from other CAM rows are selected as IMS (e.g., as row enable signals) to ML pre-charge circuit 302 of CAM row 300A, and also control whether row match signals generated on CML are provided to the PRS 150 for use as IMS signals by the same and/or one or more other arbitrarily selected CAM rows. In this manner, PRS 150 provides a programmable interconnect structure that can be dynamically configured to route match signals from any CAM row to itself and/or to one or more other arbitrarily selected CAM rows at the same time and independently of each other.

A general operation of the pre-charge circuit 302 is as follows. If ST is asserted to logic high, which indicates that row 300A of CAM cells 112 stores a first word in a data word chain, pre-charge circuit 302 turns on and, upon assertion of PCLK, pulls ML high toward VDD, thereby pre-charging ML and enabling the CAM row 300 for comparison operations, irrespective of the state of the row enable signal (ROW_EN) on the IMS line. Once ML is pre-charged, the data stored in CAM cells 112 of row 300 can be compared with input data (e.g., a search key), and the match signals are provided on ML.

If ST is de-asserted to logic low, which indicates that row 300 of CAM cells 112 stores either an intermediate word or the last word in a data word chain, then the logic state of ROW_EN on the IMS line controls the match line pre-charge operation. More specifically, if the state of ROW_EN on the IMS line received from the PRS 150 is asserted to indicate a match condition in another selected CAM row (e.g., that stores a previous word in the data word chain), the pre-charge circuit 302 turns on and pulls the match line ML high toward VDD, thereby pre-charging ML and enabling the CAM row 300A for comparison operations. Conversely, if the state of ROW_EN on the IMS line received from the PRS 150 is de-asserted to indicate a mismatch condition in the other CAM row, then pre-charge circuit 302 does not pre-charge the match line ML of the row 300, thereby disabling the CAM row 300A for the compare operation and causing a mismatch condition on the CAM row's match line ML.

For other embodiments, the match line ML of CAM row 300A can be discharged to ground potential to enable the row for compare operations, in which case the CAM cells charge ML to logic high (VDD) if there is a mismatch condition and do not charge ML if there is a match condition.

Figure 4A:
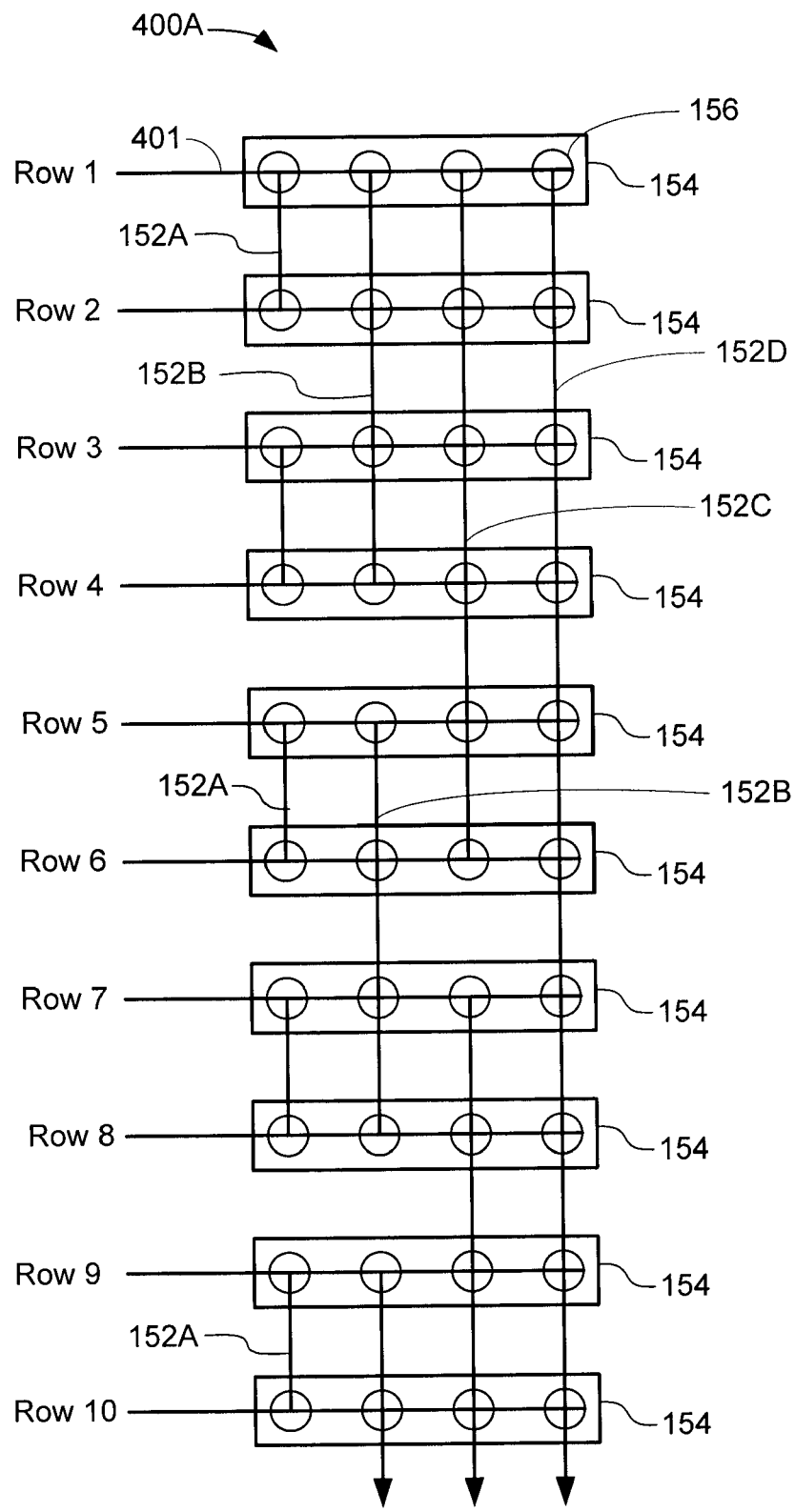
FIG. 4A shows a block diagram of one embodiment of the PRS of FIGS. 1 and 2.

FIG. 4A shows a simplified block diagram of an exemplary PRS 400A that can be used to selectively, simultaneously, and independently route match signals from any CAM row 110 in the array of CAM device 100 to one or more other arbitrarily selected CAM rows 110 in the array of CAM device 100 at the same time and independently of each other. PRS 400A, which is an exemplary embodiment of the PRS 150 of FIG. 1, is shown to include 4 columns of co-linear signal routing lines 152A-152D each spanning across various numbers of CAM rows 110, and to include a plurality of PSMs 154 each associated with a corresponding CAM row 110. For the simplified embodiment of FIG. 4A, each PSM 154 represents both the input PSM 154B and the output PSM 154A for a CAM row depicted in FIG. 3A, and can selectively connect the signal lines 401 of the corresponding CAM row to one or more of the signal routing lines 152A-152D of the PRS 400 via programmable switches 156 in response to the routing configuration data. For exemplary embodiments of FIG. 4A, the signal lines 401 in each CAM row can be the ML, IMS, and/or OMS lines.

The signal routing lines 152A-152D of PRS 400A each can be of various suitable lengths to provide a variety of different signal routing configurations for the PRS. For example, in the exemplary embodiment shown in FIG. 4A, each collinear set of signal lines 152A spans across two adjacent rows, and thus can be used to propagate the match signals between corresponding adjacent CAM rows (e.g., and thus lines 152A are referred to herein as having a length of 1x). Each collinear set of signal lines 152B spans across four rows, and thus can be used to simultaneously route match signals between a corresponding set of 3 adjacent CAM rows (e.g., and thus lines 152AB are referred to herein as having a length of 3x). Each collinear set of signal lines 152C spans across six rows, and thus can be used to simultaneously route match signals between a corresponding set of 5 adjacent CAM rows (e.g., and thus lines 152C are referred to herein as having a length of 5x). Finally, signal line 152D spans across the entire CAM array, thereby allowing match signals from any one row to be selectively and simultaneously propagated to all other CAM rows in the array via signal line 152D.

Although only four columns of signal routing lines 152 are shown in FIG. 4A, it is to be understood that in actual embodiments, the PRS 400A may include any number of columns each including a number of collinear signal routing lines 152. Further, the particular length and arrangement of signal routing lines 152A-152D in FIG. 4A is merely illustrative; for actual embodiments, PRS 400A may include any combination of signal lines 152 of varying lengths, as may be suitable for a particular application.

Figure 4B:
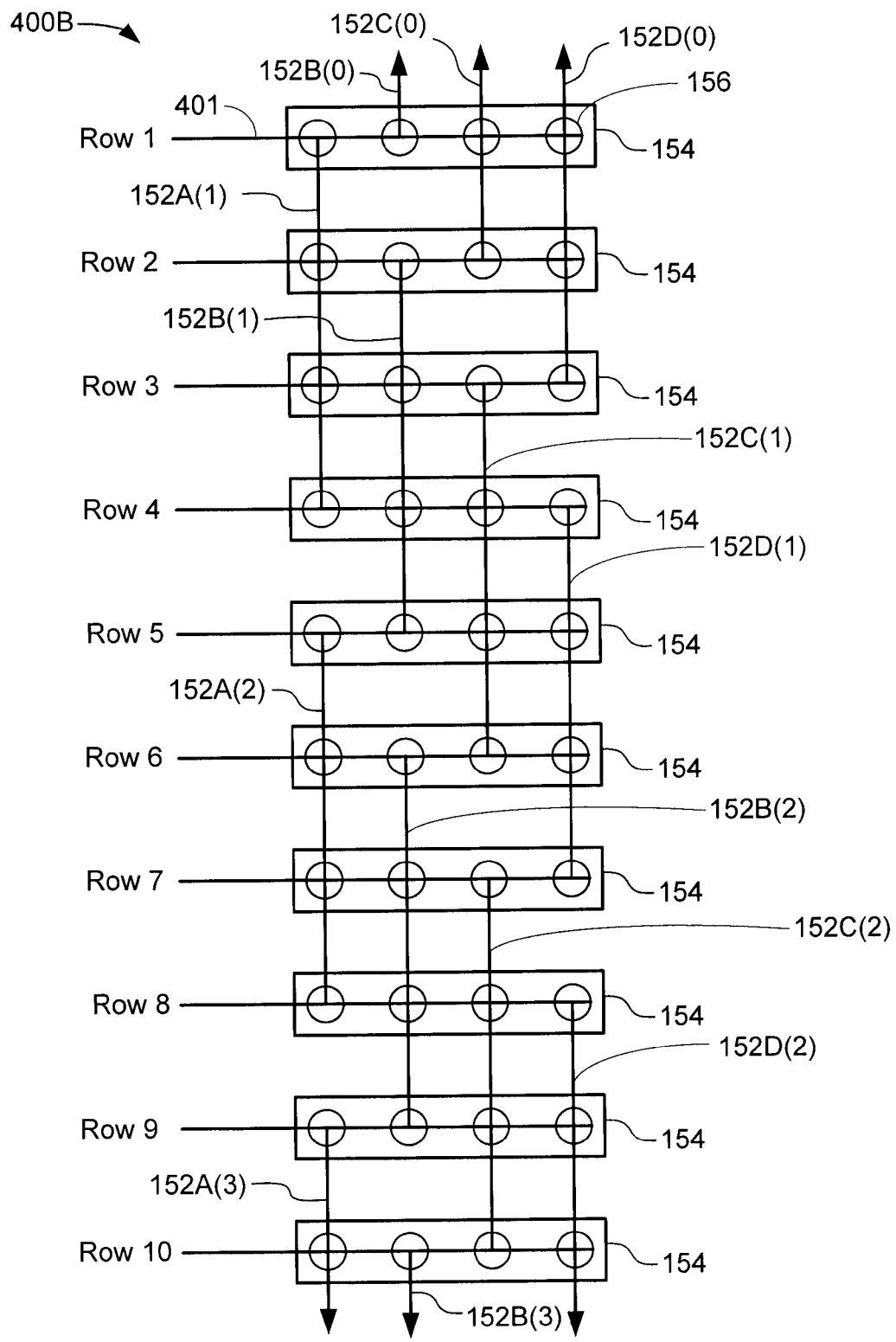
FIG. 4B shows a block diagram of another embodiment of the PRS of FIGS. 1 and 2.

To minimize the parasitic capacitance and signal degradation of the PRS routing lines, other embodiments can employ columns of relatively short routing lines, and the routing lines of each PRS column can be staggered or offset with respect to one another to maximize the number of CAM rows that can be interconnected by the PRS' relatively short-length PRS signal lines. For example, FIG. 4B shows a simplified block diagram of another PRS 400B having 4 columns of co-linear signal routing lines 152A-152D that are staggered with respect to each other. Each PRS column includes a set of collinear routing lines 152 that each span between a corresponding set of 4 adjacent CAM rows (e.g., and thus have a line length of 3x), and the sets of routing lines of the columns are offset with respect to one another, as depicted in FIG. 4B. For example, the first PRS column includes routing line 152A(1) that extends between CAM rows 1-4, routing line 152A(2) that extends between CAM rows 5-8, and routing line 152A(3) that extends between CAM rows 9,10, and the next 2 subsequent CAM rows (not shown for simplicity in FIG. 4B). The second PRS column includes routing line 152B(1) that extends between CAM rows 2-5, routing line 152B(2) that extends between CAM rows 6-9, and routing line 152B(3) that extends between CAM row 10 and the next three subsequent CAM rows (not shown for simplicity), as well as a routing line 152B(0) that extends between CAM row 0 and the 3 preceding CAM rows (not shown for simplicity). The third PRS column includes routing line 152C(1) that extends between CAM rows 3-6, routing line 152C(2) that extends between CAM rows 7-10, as well as a routing line 152C(0) that extends between CAM rows 1, 2 and the preceding 2 CAM rows (not shown for simplicity). The fourth PRS column includes routing line 152D(1) that extends between CAM rows 4-7, routing line 152D(2) that extends between CAM rows 8-10 and the next subsequent CAM row (not shown for simplicity), as well as a routing line 152D(0) that extends between CAM rows 1-3 and the preceding CAM row (not shown for simplicity).

Because the signal routing lines 152 in the columns of PRS 400B are staggered with respect to each other, the PRS 400B can selectively route match signals from each CAM row to one or more of its 6 neighbor CAM rows (i.e., the 3 preceding CAM rows and the 3 subsequent CAM rows) using signal routing lines having a length of only 3x, thereby reducing parasitic capacitance of the routing lines compared to routing lines that extend across greater numbers of CAM rows. In this manner, the staggered nature of PRS 400B of FIG. 4B provides a more flexible match signal routing scheme than the non-staggered PRS 400A of FIG. 4A, and can facilitate the grouping of CAM rows of a PRS-equipped CAM array into a number of blocks having robust intra-block and inter-block match signal routing capabilities. As a result, regular expressions can be divided into a number of smaller sub-expressions that are each stored in a corresponding block of CAM rows of a PRS-equipped CAM array, and the staggered PRS can provide intra-block match signal routing (e.g., to implement each sub-expression) and provide inter-block match signal routing (e.g., to connect the various sub-expressions to implement the regular expression) without using signal routing lines that extend across the CAM array.

Figure 5A:
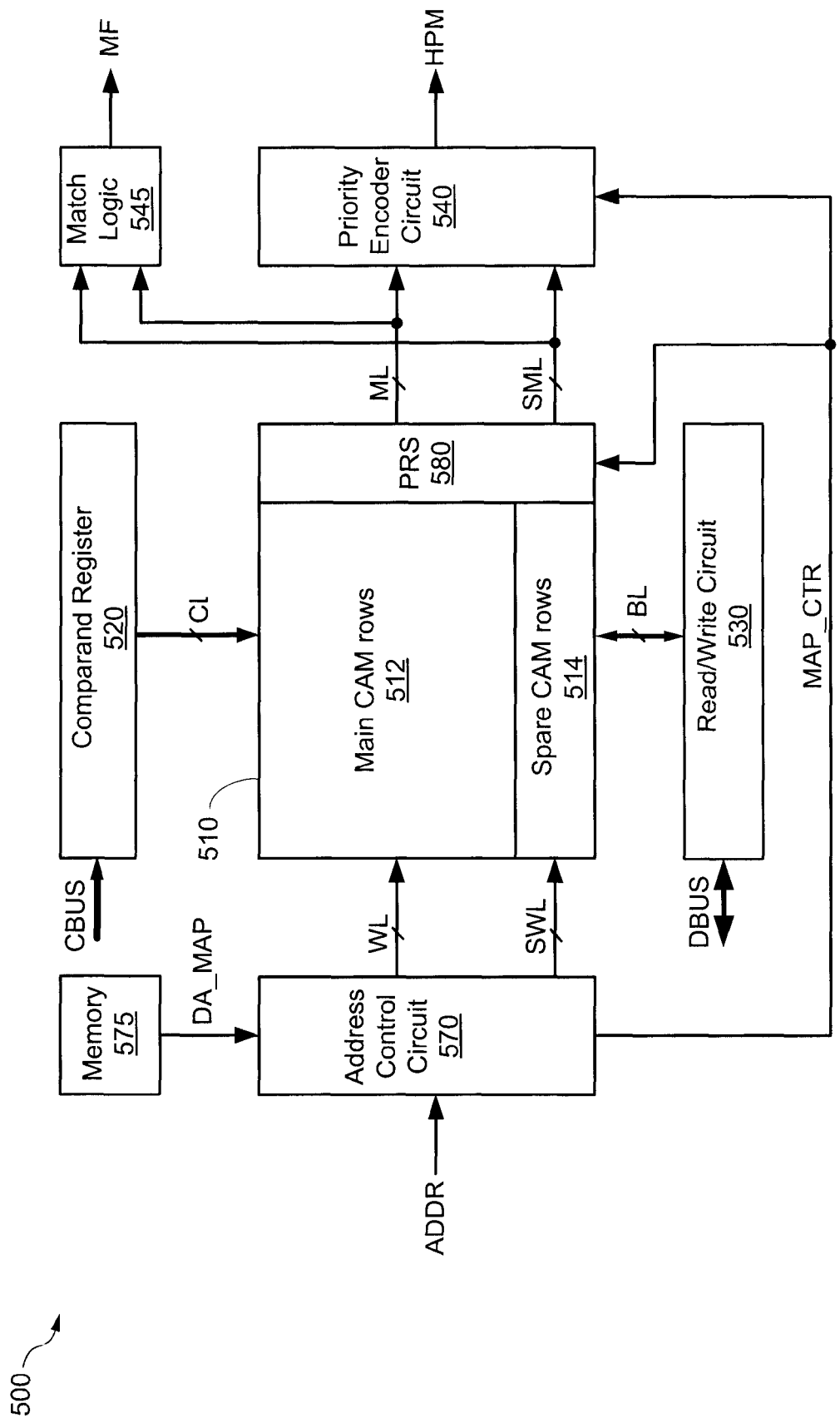
FIG. 5A shows a simplified block diagram of a CAM device including a row redundancy mechanism in accordance with the present embodiments.

FIG. 5A shows one embodiment of a CAM device 500 in accordance with present embodiments. CAM device 500 includes a CAM array 510, a comparand register 520, a read/write circuit 530, a priority encoder circuit 540, match logic 545, a configurable address control circuit 570, a memory element 575, and a PRS 580. CAM array 510 includes a plurality of regular or main CAM rows 512 and one or more spare CAM rows 514. The spare CAM row 514 is an independent row of CAM cells that can be enabled to functionally replace the main CAM rows 512 in CAM 510 that are defective and/or have defective CAM cells. The CAM cells included in main CAM rows 512 and spare CAM row 514 can be any suitable type of CAM cell including, for example, binary CAM cells, ternary CAM cells, quaternary CAM cells, SRAM-based CAM cells, DRAM-based CAM cells, and so on.

One or more instructions and related control signals can be provided to CAM device 500 from an instruction decoder (not shown for simplicity in FIG. 5A) to control read, write, compare, initialization, and other operations for CAM device 500. Other well-known signals which can be provided to CAM device 500, such as enable signals, clock signals, and power connections, are not shown for simplicity. Further, although not shown in FIG. 5A for simplicity, CAM device 500 includes a configuration circuit 160 (see also FIG. 1) that provides routing configuration information RCFG (e.g., ST and END bits) to the CAM rows and provides routing control information RCTR to the PRS 580.

Each main CAM row 512 is coupled to configurable address circuit 570 via a corresponding word line WL, and to priority encoder circuit 540 and match logic 545 via a corresponding match line ML. Similarly, each spare row 514 of CAM cells is coupled to address control circuit 570 via a corresponding spare word line SWL, and to priority encoder circuit 540 and match logic 545 via a corresponding spare match line SML. For simplicity, the word lines and match lines for CAM array 510 are represented collectively in FIG. 5A. Further, although not shown in FIG. 5A, each main CAM row 512 and each spare row 514 can have one or more validity bits to indicate whether the corresponding row (or any segment thereof) of CAM cells stores valid data. In addition, for some embodiments, the main CAM rows 512 and spare rows 514 can be divided into a plurality of row segments, for example, to reduce the capacitive loading for each row or to provide multiple width/depth configurations for the array.

The match lines ML and spare match lines SML provide match results for compare operations between comparand data (e.g., a search key) and words stored in main CAM rows 512 and spare CAM rows 514, respectively, to priority encoder circuit 540. In response thereto, priority encoder circuit 540 determines the matching entry that has the highest priority number associated with it and generates the index or address of this highest priority match (HPM). In addition, priority encoder circuit 540 can use the validity bits from CAM array 510 to generate the next free address (NFA) that is available in CAM array 510 for storing new data. Although not shown in FIG. 5A, for some embodiments, priority encoder circuit 540 provides NFA and/or HPM to address control circuit 570.

Match logic 545 is well-known, and uses the match results from CAM array 510 to generate a match flag MF indicative of a match condition, and can generate a multiple match flag to indicate multiple matches. In addition, match logic 545 can use the validity bits from CAM array 510 to assert a full flag when all of the rows of CAM cells in CAM array 510 are filled with valid entries.

Each column of CAM cells in CAM array 510 is coupled to comparand register 520 via comparand lines CL and to read/write circuit 530 via bit lines BL. For simplicity, the comparand lines CL and bit lines BL are represented collectively in FIG. 5A. Comparand register 520 is well-known, and can be configured to receive comparand words from a comparand bus CBUS. For other embodiments, comparand data can be provided to CAM array 510 via another bus and/or circuit. Read/write circuit 530 includes well-known write drivers to write input data to CAM array 510 via a data bus DBUS, and includes well-known sense amplifiers to read output data from CAM array 510 via DBUS.

Memory element 575 includes one or more storage locations, each to store an address of a defective CAM row 512 that a corresponding spare row 514 is to functionally replace. For some embodiments, each storage location in memory element 575 also includes a disable bit that indicates whether the CAM row 512 identified by the defective address is to be disabled and functionally replaced by the corresponding spare row 514. Memory element 575 may be any suitable storage device, and for some embodiments can be included within address control circuit 570. For some embodiments, memory element 575 is a fuse bank. For other embodiments, memory element 575 is a non-volatile memory device such as, for example, EPROM, EEPROM, or flash memory. For other embodiments, memory element 575 may be eliminated, and the defective row address(es) may be stored in a suitable external memory device and provided to CAM device 500 during initialization, reset, or other operations.

Address control circuit 570, which can control the functional replacement of defective CAM rows 512 with spare rows 514, includes first inputs to receive an input address ADDR, and a second input to receive the defective row address mapping information (DA_MAP) from memory 575. DA_MAP can include the addresses of defective CAM rows 512 and/or mapping information indicating which main CAM rows 512 are selected for replacement by the spare CAM rows 514 and/or which main CAM rows have been re-assigned (e.g., to other CAM blocks) or re-mapped. Address control circuit 570 also includes first outputs to selectively drive the word lines WL and spare word lines SWL of the array 510 in response to ADDR and DA_MAP, and includes a second output to provide control signals MAP_CTR indicative of DA_MAP to priority encoder circuit 540 and PRS 580. When there are no defective CAM rows, address control circuit 570 selects the word lines WL in response to ADDR for read and write operations, and provides de-asserted control signals MAP_CTR to priority encoder circuit 540 during compare operations so that priority encoder circuit 540 operates in a conventional manner to generate the HPM index. Conversely, if there are defective CAM rows, address control circuit 570 translates ADDR using DA_MAP to select the word lines WL for read and write operations, and during compare operations provides control signals MAP_CTR to priority encoder circuit 540 that cause priority encoder circuit 540 to consider row address re-assignments and/or re-mapping resulting from defective row replacement when generating the HPM index.

PRS 580, which is one embodiment of PRS 150 of FIG. 1, includes a number of columns of signal routing lines that can be configured to selectively route match signals between the main CAM rows 512 to store and implement regular expression search operations in a manner similar to that described above with respect to FIGS. 1-3. In addition, the PRS 580 implements a row redundancy mechanism that can functionally replace a defective CAM row by enabling a spare CAM row and then rippling available CAM rows through the array to the defective CAM row using a sequential row address re-mapping technique. In this manner, a defective CAM row can be functionally replaced by a selectively re-assigned non-defective CAM row without employing the PRS to re-route the match signals associated with the defective CAM row across the array 510 to the spare CAM row 514, and without directly mapping the defective CAM row to the spare CAM row.

Figure 5B:
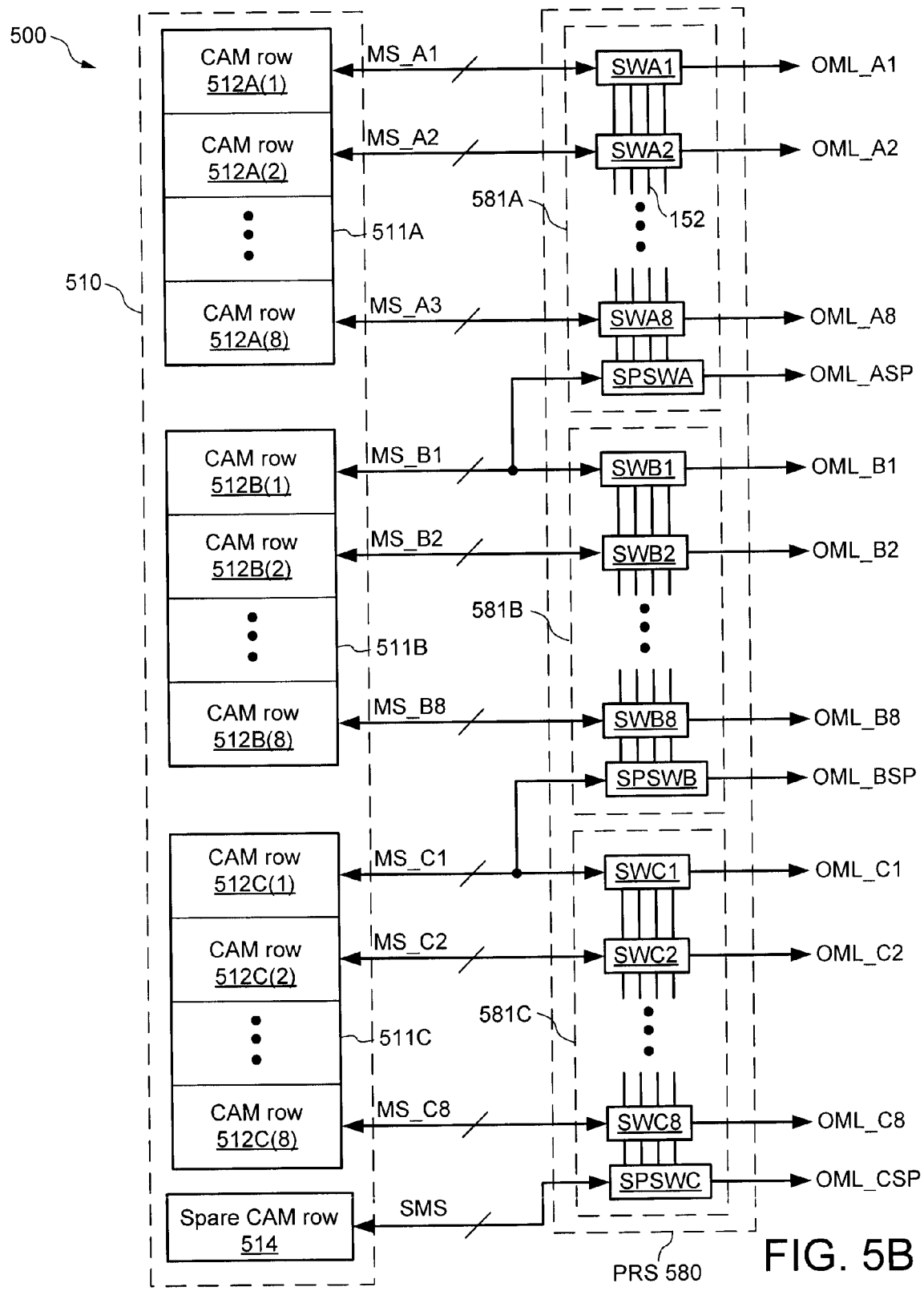
FIG. 5B illustrates the functionally replacement of a defective CAM row using row redundancy mechanisms in accordance with the present embodiments.

FIG. 5B shows the CAM array 510 and PRS 580 of CAM device 500 in more detail. CAM array 510, which is another embodiment of CAM array 100 of FIG. 1, is shown to include 3 CAM blocks 511A-511C, and a spare CAM row 514. Each CAM block 511 includes 8 CAM rows 512. Each CAM row 512 includes a plurality of CAM cells and associated control circuitry (not shown in FIG. 5B for simplicity), and is coupled to the PRS 580 via a number of corresponding match signal lines (MS) and to the priority encoder circuit 540 (see also FIG. 5A) via a corresponding output match line (OML). For the exemplary embodiments described herein, CAM rows 300 of FIG. 3A are employed as CAM rows 512 of CAM array 510, and thus the MS lines of FIG. 5B collectively represent the ML and IMS lines of the CAM row 300 of FIG. 3A. Thus, as described above with respect to FIG. 3A, each CAM row 512 is selectively enabled to compare a search key with data stored therein in response a start bit and input match signals (e.g., from one or more other CAM rows) to generate a match signal for the row, which in turn can be selectively provided to the PRS 580 and routed as an input match signal to other CAM rows and/or to the priority encoder circuit 540.

Spare CAM row 514 includes a plurality of CAM cells and associated control circuitry (not shown in FIG. 5B for simplicity), and is coupled to the PRS 580 via a number of corresponding spare match signal lines (SMS) and to the priority encoder circuit 540 (see also FIG. 5A) via a corresponding spare output match line (OML). For the exemplary embodiments described herein, CAM row 300 of FIG. 3A is employed as spare CAM row 514 of CAM array 500, and thus the SMS lines of FIG. 5B collectively represent the ML and IMS lines of CAM row 300 of FIG. 3A.

For the exemplary embodiment of CAM device 500 shown in FIG. 5B, the spare CAM row 514 is positioned at the bottom of the array 510 (e.g., after the last CAM block 511C). For other embodiments, spare CAM row 514 can be positioned at the top of the array 510 (e.g., before the first CAM block 511A), between a selected pair of CAM blocks 511, or in any other suitable location. Further, although only 1 spare CAM row 514 is shown in FIG. 5B for simplicity, other embodiments can include more than one spare CAM row 514.

Figure 3B:
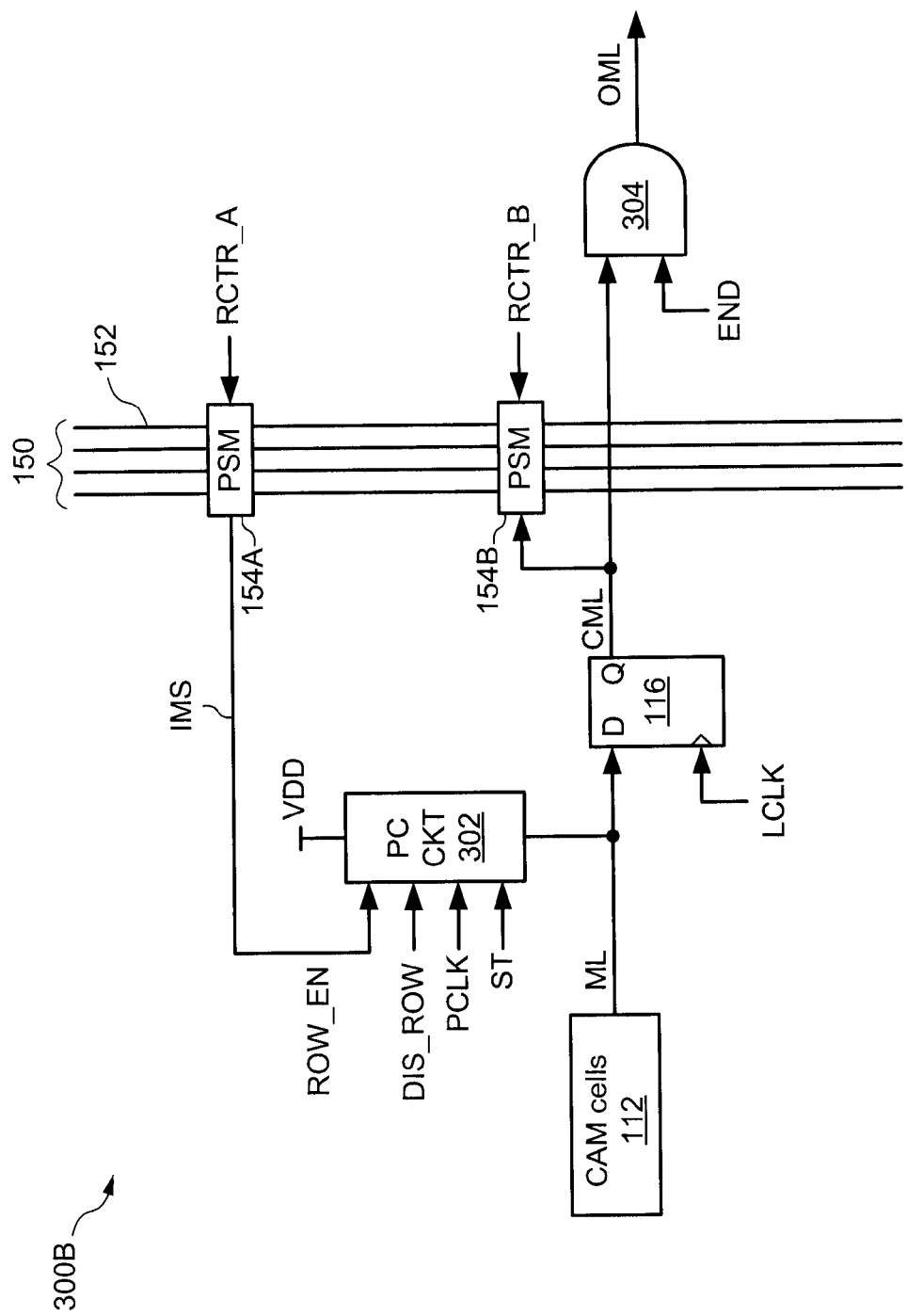
FIG. 3B shows a block diagram of another embodiment of the CAM rows responsive to a row disable signal.

Although not shown in FIG. 5B for simplicity, for the exemplary embodiments described herein, each CAM row 512 is configured to receive a row disable signal that selectively disables the CAM row for compare operations, and the CAM row 514 is configured to receive a spare row enable signal that selectively enables the spare CAM row for compare operations. For some embodiments, the row disable signal for each CAM row 512 can be provided to a fourth input of the row's match line pre-charge circuit 302, as depicted in FIG. 3B, so that each row disable signal can be used to selectively disable the match line pre-charge circuit 302 of a corresponding CAM row. More specifically, referring to FIG. 3B, if the row disable signal (DIS_ROW) of FIG. 3B is de-asserted (e.g., to logic low), the pre-charge circuit 302 enables the CAM row 300 to operate in the manner described above with respect to FIG. 3A. Conversely, if the row disable signal (DIS_ROW) is asserted (e.g., to logic high), the pre-charge circuit 302 disables the CAM row 300 and prevents the CAM row from participating in the compare operation by maintaining the CAM row's match line in a discharged state (e.g., thereby forcing a mismatch condition for the row).

Figure 3C:
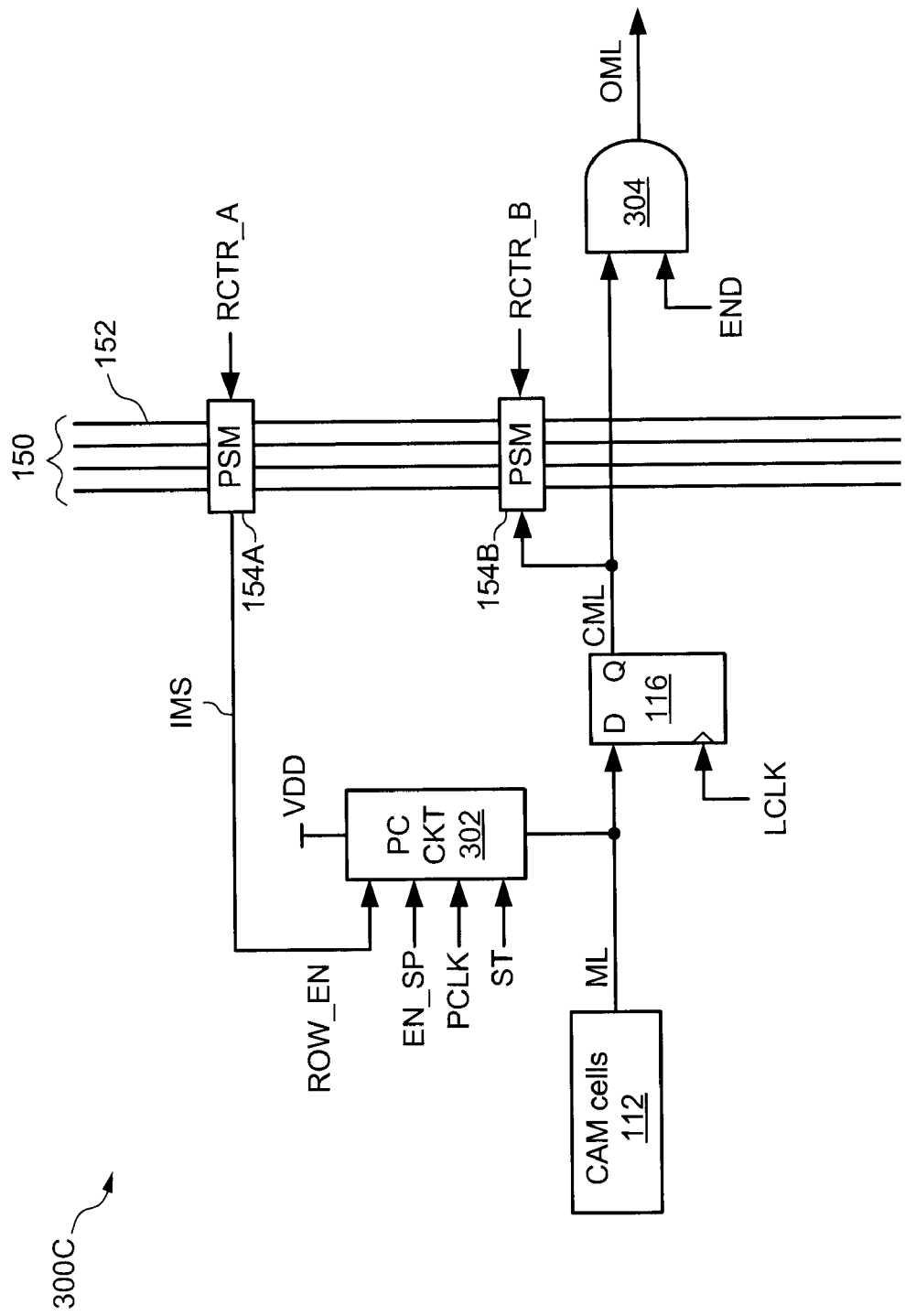
FIG. 3C shows a block diagram of an embodiment of a spare CAM row responsive to a spare row enable signal.

In a similar manner, the spare row enable signal (EN_SP) for the spare CAM row 514 can be provided to a fourth input of the row's match line pre-charge circuit 302, as depicted in FIG. 3C, so that the spare row enable signal can be used to selectively enable the match line pre-charge circuit 302 of the spare CAM row 514. For example, if the spare row enable signal (EN_SP) is asserted (e.g., to logic high), the pre-charge circuit 302 enables the spare CAM row 514 to participate in compare operations in the manner described above with respect to FIG. 3A, and conversely, if the spare row enable signal (EN_SP) is de-asserted (e.g., to logic low), the pre-charge circuit 302 disables the spare CAM row 514 and prevents the spare CAM row 514 from participating in the compare operation (e.g., by maintaining the spare CAM row's spare match line in a discharged state to force a mismatch condition for the row).

For another embodiment, each CAM row 512 in the CAM array 510 can include an additional latch (not shown for simplicity) dedicated for storing a control bit that, when asserted, disables the row by forcing the row's match line to a mismatch state. For another embodiment, the valid bits can be used to disable corresponding defective rows.

Further, although not shown in FIG. 5B for simplicity, CAM array 510 may include a number of sequence logic circuits (e.g., counter circuits) coupled to the PRS 580 to implement quantifiers associated with regular expressions stored in device 500, for example, as described in the above referenced '992 application.

The PRS 580 includes a plurality of routing blocks 581A-581C each corresponding to one of CAM blocks 511A-511C, respectively. For the exemplary embodiment of FIG. 5B, each PRS routing block 581 includes 8 regular or main configurable switching elements (SW), a spare configurable switching element (SWSP), and a number of routing signal lines 152. Each of the main switching elements can selectively connect the match signal lines (MS) of an associated CAM row 512 in the corresponding CAM block 511 to the routing block's signal lines 152 in response to a corresponding routing control signal, and the spare switching element can selectively connect the match lines of a CAM row 512 in the next CAM block 511 to the routing block's signal lines 152 in response to a spare routing control signal (for simplicity, the routing control signals are not shown in FIG. 5B). Thus, the routing lines 152 within a PRS routing block 581 selectively route match signals between the CAM rows 512 of the corresponding CAM block 511 via the main switching elements so that the CAM rows 512 can be interconnected in a manner that implements a corresponding portion (e.g., a sub-expression) of a regular expression, for example, as described above with respect to FIGS. 1-3. Further, the routing lines 152 within a PRS routing block 581 can also selectively route match signals between a CAM row in a next CAM block 511 and the CAM rows 512 of the corresponding CAM block 511 via the spare switching element so that the CAM row 512 in the next CAM block 511 can be re-assigned to (e.g., and thus functionally replace a defective CAM row 512 in) the corresponding CAM block 511.

For example, the main switching elements SWA1-SWA8 of routing block 581A selectively connect the match lines of respective CAM rows 512A(1)-512A(8) in corresponding CAM block 511A to each other via the signal lines 152 of routing block 581A, and the spare switching element SPSWA of routing block 581A selectively connects the match lines of the first CAM row 512B(1) of the next CAM block 511B to the signal lines 152 of routing block 581A, and therefore to any number of CAM rows 512 in CAM block 511A. Similarly, the main switching elements SWB1-SWB8 of routing block 581B selectively connect the match lines of respective CAM rows 5126(1)-512B(8) in corresponding CAM block 511B to each other via the routing block's signal lines 152, and the spare switching element SPSWB of routing block 581B selectively connects the match lines of the first CAM row 512C(1) of the next CAM block 511C to the signal lines 152 of routing block 581B, and therefore to any number of CAM rows 512 in CAM block 511B. Lastly, the main switching elements SWC1-SWC8 of routing block 581C selectively connect the match lines of respective CAM rows 512C(1)-512C(8) in corresponding CAM block 511C to each other via the routing block's signal lines 152, and the spare switching element SPSWC of routing block 581C selectively connects the match lines of the spare CAM row 514 to the signal lines 152 of routing block 581C, and therefore to any number of CAM rows 512 in CAM block 511C.

Thus, for the exemplary embodiment of FIG. 5B, the match lines of the first CAM row 512B(1) of the second CAM block 511B are coupled to both the spare switching element SPSWA in the first PRS routing block 581A and to the first switching element SWB1 in the second PRS routing block 581B, and the match lines of the first CAM row 512C(1) of the third CAM block 511C are coupled to both the spare switching element SPSWB in the second PRS routing block 581B and to the first switching element SWC1 in the third PRS routing block 581C. In this manner, the first CAM row 512B(1) of the second CAM block 511B can be selectively re-assigned to the first CAM block 511A by enabling the spare switching element SPSWA in the first PRS routing block 581A and disabling the first switching element SWB1 in the second PRS routing block 581B so that the match lines of CAM row 512B(1) can be selectively interconnected to the non-defective CAM rows 512A of the first CAM block 511A via the first PRS routing block 581A. Similarly, the first CAM row 512C(1) of the third CAM block 511C can be selectively re-assigned to the second CAM block 511B by enabling the spare switching element SPSWB in the second PRS routing block 581B and disabling the first switching element SWC1 in the third PRS routing block 581C so that the match lines of CAM row 512C(1) can be selectively interconnected to the non-defective CAM rows 512B of the second CAM block 511B via the second PRS routing block 581B. Further, the spare CAM row 514 can be selectively assigned to the third CAM block 511C by enabling the spare switching element SPSWC in the third PRS routing block 581C so that the spare match lines of spare CAM row 514 can be selectively interconnected to the non-defective CAM rows 512C of the third CAM block 511C via the third PRS routing block 581C.

As described above, CAM array 510 is shown in FIG. 5B to include 3 CAM blocks 511A-511C each having 8 CAM rows 512, and the PRS 580 is shown to include 3 routing blocks 581A-581C each having 8 main switching elements. For other embodiments, CAM array 510 can include other numbers of CAM blocks 511, which can include other numbers of CAM rows 512, and PRS 580 can include other numbers of routing blocks 581, which can include other numbers of switching elements. Further, although only one spare CAM row 514 is shown in FIG. 5B, other embodiments can include other numbers of spare rows 514.

Figure 6A:
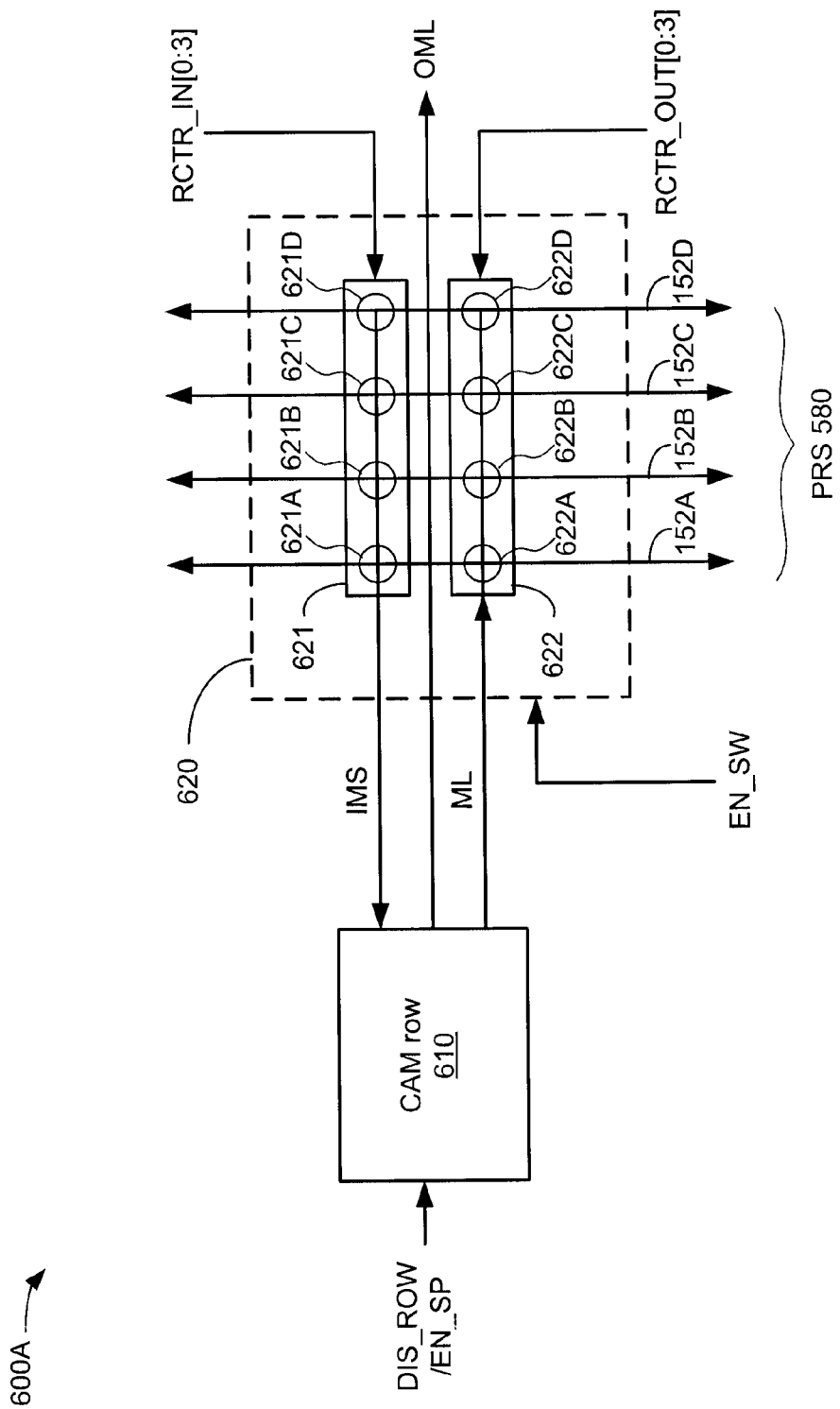
FIG. 6A shows a slice of the array of FIG. 5B depicting the selective interconnections between the input and output match signal lines of a CAM row and the PRS routing lines provided by an associated switching element.

FIG. 6A shows a slice 600A of CAM array 510 including a CAM row 610 having ML and IMS lines selectively connected to signal routing lines 152 of a corresponding PRS routing block 581 via an associated switching element 620. CAM row 610, which is one embodiment of CAM rows 512 and/or spare CAM row 514 of FIGS. 5A-5B, receives the row disable signal (DIS_ROW) if it is used as main CAM row 512, and receives the spare row enable signal (EN_SP) if it is used as spare CAM row 514. Switching element 620, which is one embodiment of the switching elements (SW) and the spare switching elements (SPSW) in the PRS 580 of FIG. 5B, includes an input switch matrix 621 and an output switch matrix 622. Input switch matrix 621 includes four configurable switches 621A-621D that selectively connect the CAM row's IMS line to PRS routing signal lines 152A-152D, respectively, in response to input routing control signals RCTRL_IN [0:3]. Output switch matrix 622 includes four configurable switches 622A-622D that selectively connect the CAM row's ML line to PRS routing signal lines 152A-152D, respectively, in response to output routing control signals RCTRL_OUT [0:3]. Configurable switches 621 and 622 can be any suitable switch or switching circuit that selectively connects a corresponding PRS signal line to the CAM row's match signal lines in response to the routing control signals. For some embodiments, configurable switches 621 and 622 are embodiments of switching elements 154 of FIGS. 4A-4B, and the control signals RCTR_IN and RCTR_OUT are embodiments of RCTR_A and RCTR_B, respectively, of FIGS. 4A-4B.

Figure 6B:
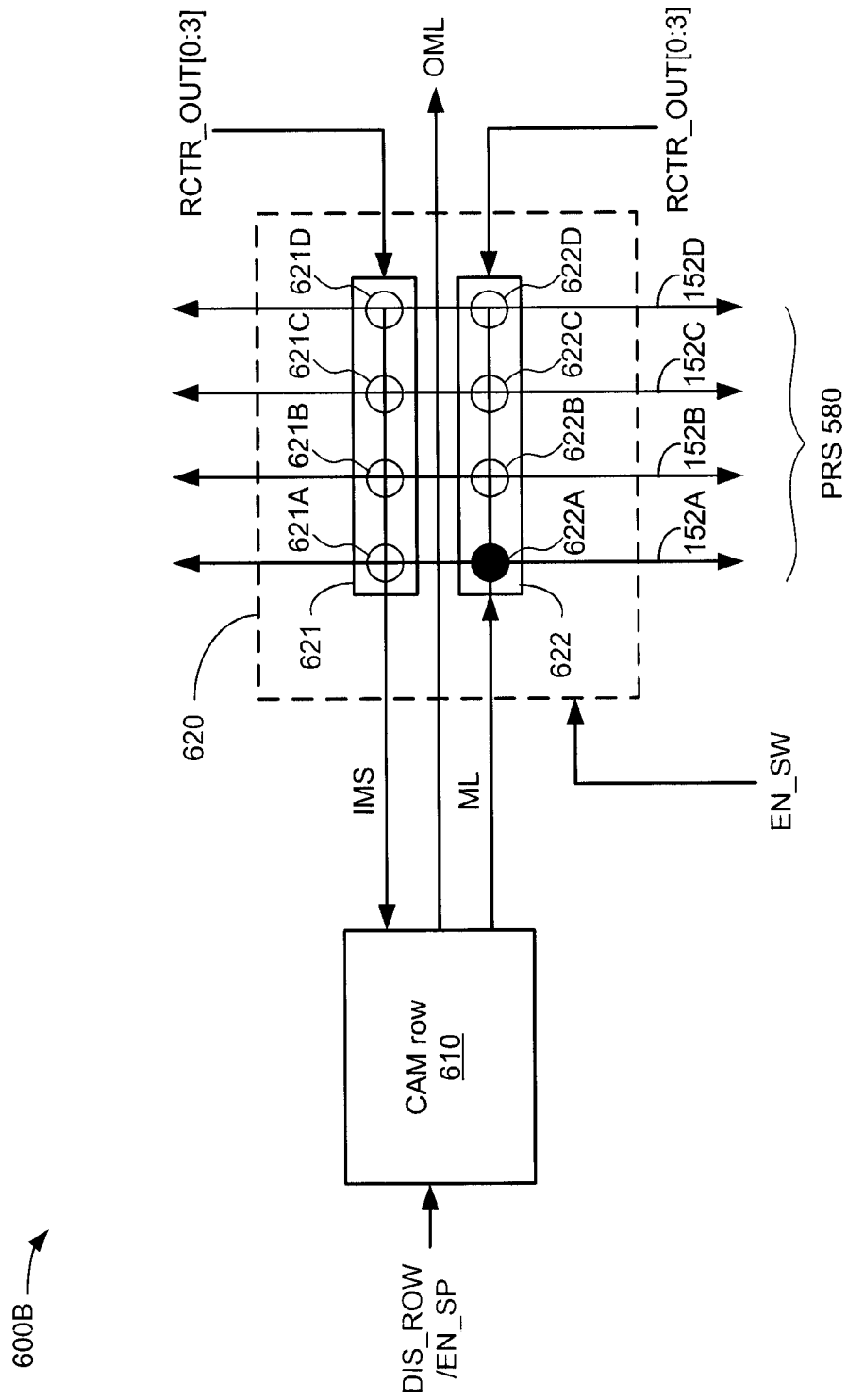
FIG. 6B shows a slice of FIG. 6A including a CAM row having its ML line connected to a PRS routing line via an associated PRS switching element.

The routing control signals RCTR configure the configurable switches 621-622 to determine the selective interconnections provided between the ML and IMS lines of CAM row 610 and the match input and output lines of other CAM rows (not shown in FIG. 6A for simplicity) by the PRS lines 152. For some embodiments, the assertion of signal RCTR (e.g., to logic high) causes the associated configurable switch to connect the CAM row's match line to the associated PRS routing line 152, while the de-assertion of signal RCTR (e.g., to logic low) causes the associated configurable switch to disconnect or isolate the CAM row's match line to the associated PRS routing line 152. For example, referring to the switch element 600B in FIG. 6B, output switch 622A is shown to be in a conductive state, as indicated by the solid circle, in response to assertion of its corresponding control signal RCTR[0]. When conductive, switch 622A connects the ML of CAM row 610 to the PRS routing line 152A, which in turn can route the match signal from CAM row 610 as an input match signal to other CAM rows (not shown in FIG. 6B for simplicity). Note that all other output switches 622B-662D are non-conductive, as indicated by transparent circles, caused by de-assertion of corresponding signals RCTR_OUT [1:3]. Similarly, none of input switches 621A-621D are conductive, thereby isolating the IMS line of CAM row 610 from the PRS 581.

Switching element 620 also includes an input to receive the enable switch signal (EN_SW) that can selectively enable and disable the switching element 620. For example, if EN_SW is asserted, then switching element 620 is enabled to make the interconnections between CAM row 610 and the PRS routing lines 152 selected by the routing control signals RCTR. Conversely, if EN_SW is de-asserted, then switching element 620 is disabled and preventing from connection the match lines of CAM row 610 to the routing lines 152 of PRS routing block 581, irrespective of the routing control signals RCTR. For some embodiments, the switch enable signals (EN_SW) are driven (e.g., by a suitable logic circuit or driver) in response to MAP_CTR to selectively enable or disable corresponding switching elements.

Figure 6C:
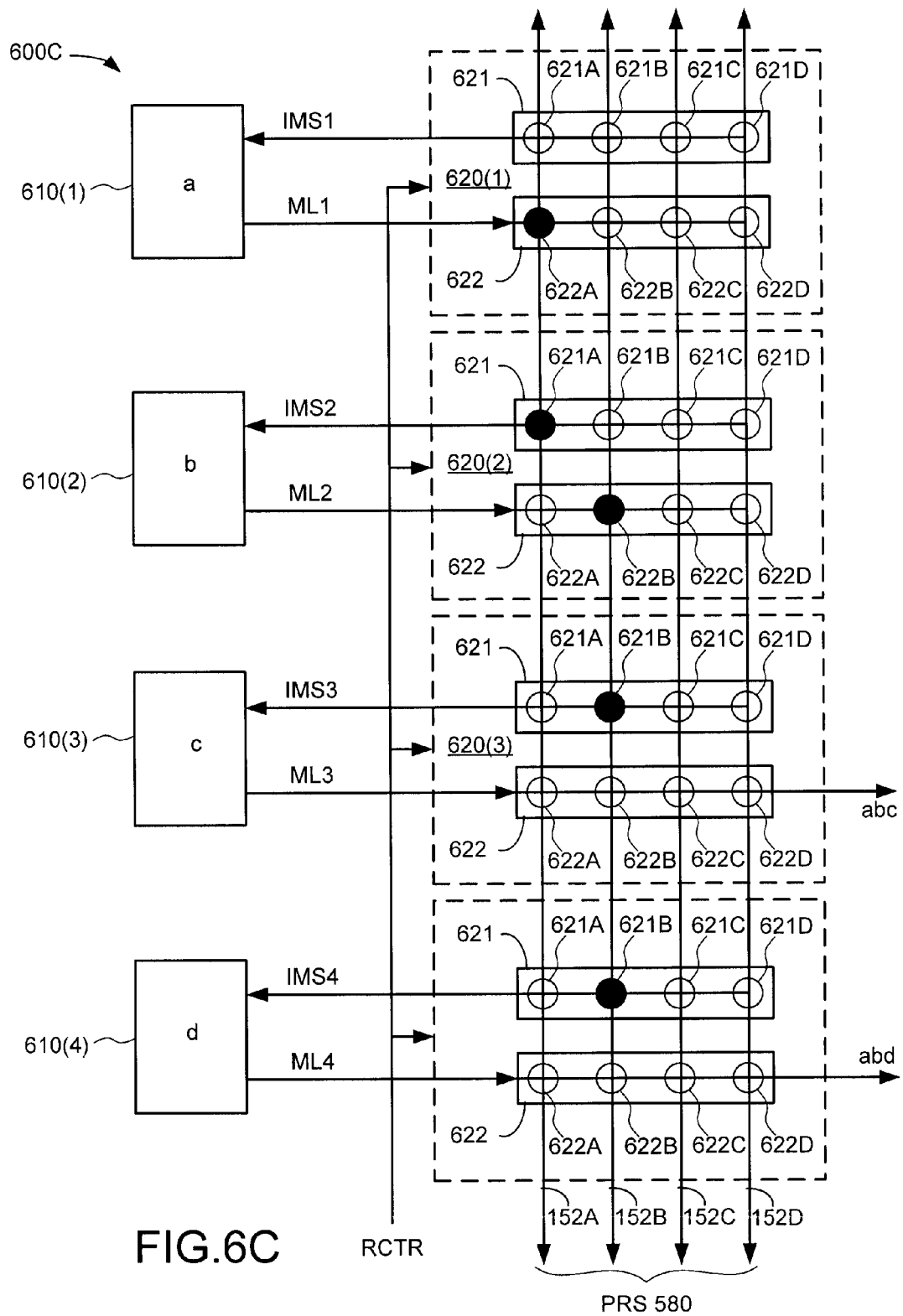
FIG. 6C shows a PRS configured to interconnect four CAM rows of the array of FIG. 5B storing respective characters "a," "b", "c," and "d" in a manner that implements the regular expression R10=ab(c|d)

As described above, the PRS 580 can be used to selectively interconnect the CAM rows together in a manner that allows the CAM array to implement regular expression search operations. For example, FIG. 6C shows a 4 row slice 600C in which the PRS is configured to interconnect four CAM rows 610(1)-610(4) storing respective characters "a," "b", "c," and "d" in a manner that implements the regular expression R10=ab(c|d). As depicted in FIG. 6C, the PRS of slice 600C is configured to route the match signal on ML1 from row 610(1) as the row enable signal via IMS2 to row 610(2), and to route the match signal on ML2 from row 610(2) as the row enable signal simultaneously to rows 610(3) and 610(4) via IMS3 and IMS4, respectively. The row configuration bits ST and END are set to appropriate values so that row 610(3) outputs a match signal indicative of the string "abc" and row 610(4) outputs a match signal indicative of the string "abd", as depicted in FIG. 6C.

In addition, the PRS 580 can be used to functionally replace a defective CAM row 512 in the array with an available non-defective CAM row without re-routing the match signals associated with the defective CAM row across the array to the spare CAM row using the routing lines 152 of the PRS (e.g., where there can be several, tens, or even hundreds of intervening CAM rows between the defective CAM row and the spare CAM row). Otherwise, if the defective CAM row is directly mapped to and specifically replaced by a spare row located across the array from the defective row, the match signals associated with the defective row would have to be re-routed across the array to the spare row using long, dedicated signal lines of the PRS. Not only would these long routing lines create undesirable parasitic capacitance and signal degradation, but these long routing lines would no longer be available for routing match signals between groups of CAM rows to implement regular expression search operations. Thus, if conventional row redundancy techniques that employ direct mapping between the defective CAM row and the spare CAM row are used in a PRS-equipped CAM device, each occurrence of a defective CAM row undesirably reduces the amount signal routing available for implementing regular expressions.

Although the PRS signal lines 152 do not extend across CAM block boundaries in the exemplary embodiment of FIG. 5A, for other embodiments, the PRS signal lines can extend across CAM block boundaries (e.g., between switching elements corresponding to CAM rows in different CAM blocks) to facilitate match signal routing between CAM rows of different (e.g., adjacent and non-adjacent) CAM blocks 511.

Figure 7A:
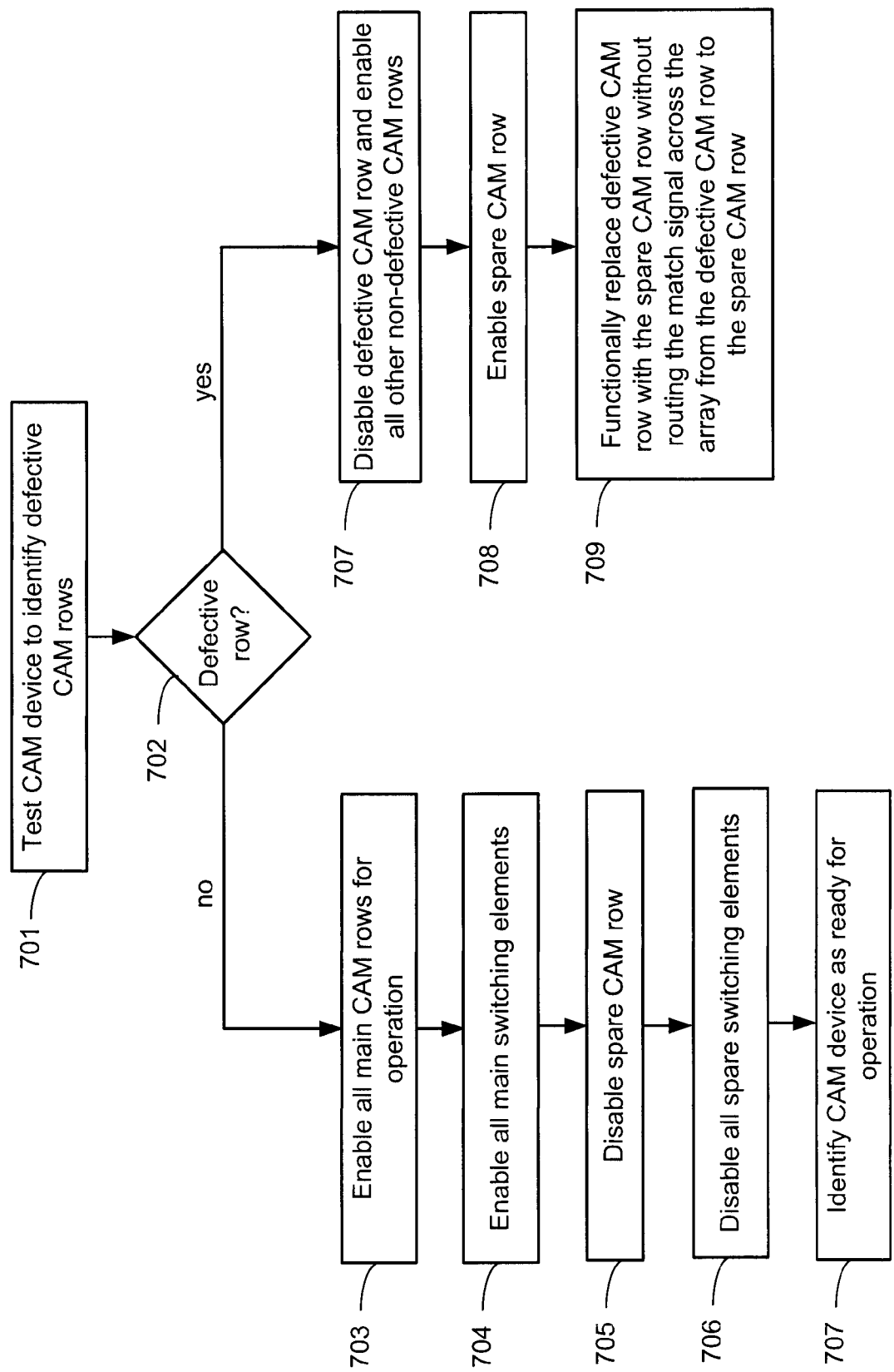
FIG. 7A is an illustrative flow chart depicting an exemplary operation of the CAM device of FIGS. 5A-5B.

An exemplary operation of CAM device 500 is described below with respect to the illustrative flow chart of FIG. 7A. First, one or more well-known testing techniques can be used to determine whether there is a defective CAM row in the array (701). If there is not a defective CAM row, as tested at step 702, then all the main CAM rows 512 are enabled for compare operations (e.g., by de-asserting all row disable signals DIS_ROW) (703), all main switching elements (SW) are enabled (704), the spare CAM row 514 is disabled (705), and the spare switching elements in all PRS routing blocks 581 are disabled (706). By disabling the spare switching elements, the first row 512 in each CAM block 511 is not coupled to the routing block 581 associated with the previous CAM block 511, but rather remains assigned to its own CAM block 511, and therefore CAM array 510 retains its original CAM row assignments and addresses. Thereafter, CAM array 510 can perform search operations between a search key and data stored in its CAM rows 512 in a normal manner (e.g., as described above with respect to FIGS. 1-3).

For some embodiments, the spare switching elements (SPSW) in the routing blocks 581 include a control terminal to receive a switch enable signal (EN_SP) that selectively enables and disables the spare switching element, as described above with respect to FIG. 6A. For other embodiments, each spare switching element can be disabled by de-asserting all of its corresponding routing controls signals, for example, so that the spare switching element does not connect the match signals lines of an associated CAM row to the PRS lines 152 of any routing block 581.

However, if a defective CAM row is detected, as tested at step 702, the defective CAM row 512 is disabled, and all other main CAM rows 512 are enabled (707). As described above, for some embodiments, the defective CAM row 512 can be disabled by asserting its row disable signal (e.g., to cause the row's match line pre-charge circuit 302 to force its ML to a mismatch condition during compare operations), and the other main CAM rows 512 can be enabled by de-asserting their row disable signals (e.g., to enable their match line pre-charge circuits 302). Then, the spare CAM row 514 is enabled (708). For some embodiments, the spare CAM row 514 is enabled by asserting the spare row enable signal (EN_SP) to enable its match line pre-charge circuit 302 to pre-charge the spare match line SML for compare operations. Then, the defective CAM row 512 is functionally replaced by rippling an available non-defective CAM row from the spare CAM row 514 across the array to the defective CAM row 512 using a sequential row address re-mapping technique (709). In this manner, the loss of the defective CAM row is offset by the activation of the spare CAM row 514 without re-routing the match signals associated with the defective CAM row 512 across the array to the spare CAM row 514.

Figure 7B:
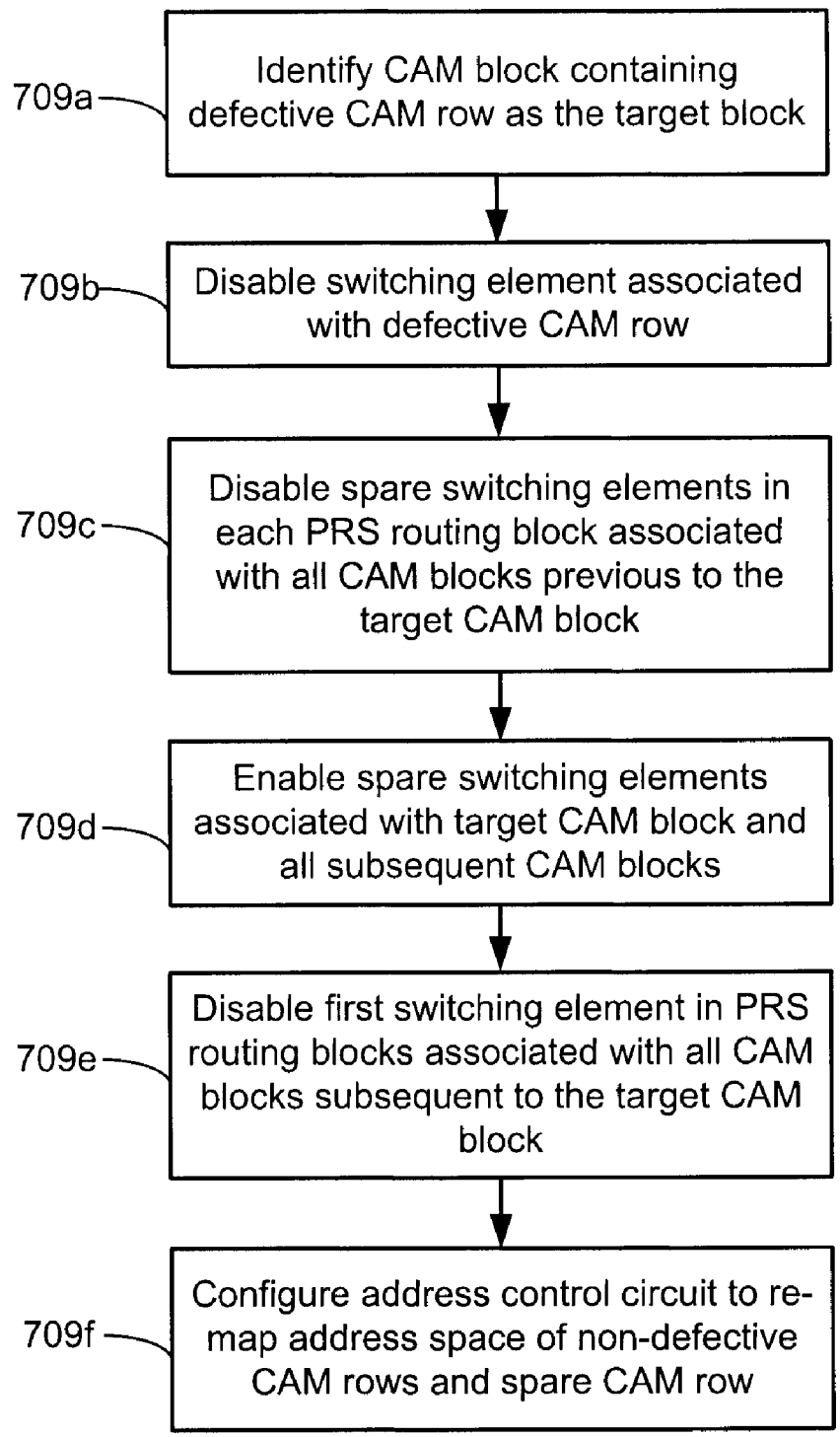
FIG. 7B is an illustrative flow chart depicting an exemplary row replacement operation of the CAM device of FIGS. 5A-5B.

More specifically, an exemplary row replacement operation in accordance with present embodiments is described below with respect to the illustrative flow chart of FIG. 7B and the exemplary array depicted in FIG. 8. First, the CAM block 511 containing the defective CAM row is identified as a target CAM block (709*a*).

Figure 8:
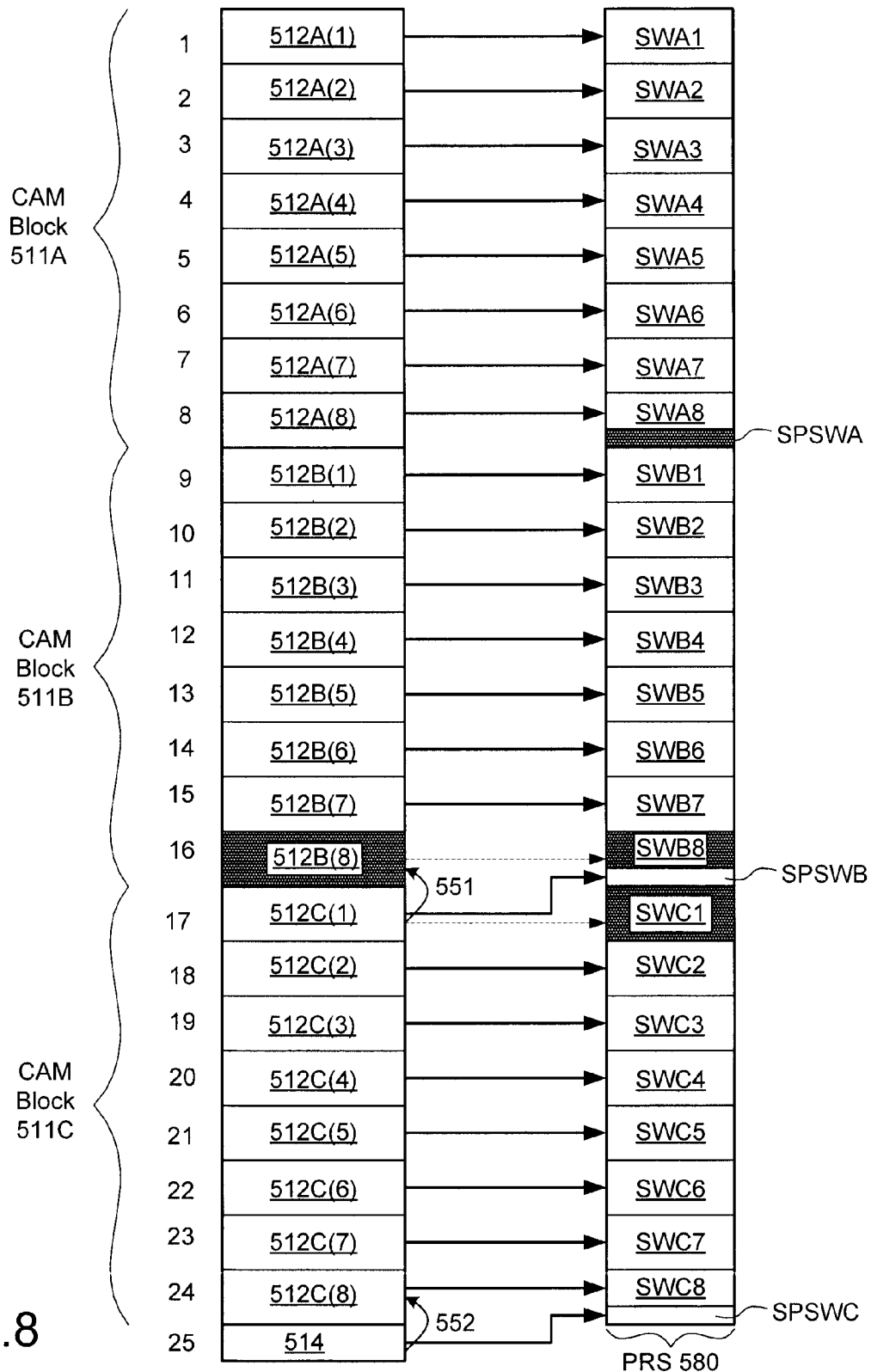
FIG. 8 shows an exemplary embodiment of the CAM device of FIG. 5B having a defective CAM row functionally replaced according to present embodiments.

For the present example, if row 512B(8) of CAM block 511B is determined to be defective, it is disabled from participating in compare operations by asserting its corresponding row disable signal, the spare CAM row 514 is enabled for compare operations by asserting its spare row enable signal, and CAM block 511B is identified as the target CAM block, as indicated in FIG. 8.

Then, the PRS switching element associated with the defective CAM row 512 is disabled (709*b*). In this manner, the defective CAM row 512 is de-coupled from its corresponding PRS routing block 581, and thus cannot exchange match signals with other rows. For some embodiments, the switching element (SW) includes a control terminal to receive a switch enable signal (EN_SW) that selectively enables and disables the spare switching element, as described above with respect to FIG. 6A. For other embodiments, each spare switching element can be disabled by de-asserting all of its corresponding routing controls signals, for example, so that the spare switching element does not connect the match signals lines of an associated CAM row to the PRS lines 152 of any routing block 581.

For the example of FIG. 8, the defective CAM row 512B(8)'s associated switching element SWB8 is disabled to de-couple the defective CAM row 512B(8) from corresponding PRS routing block 581B, for example, by de-asserting its switch enable signal EN_SW.

Next, the spare switching elements in the PRS routing blocks 581 corresponding to all CAM blocks 511 preceding (e.g., above or having lower row addresses than) the target CAM block 511 are disabled (709*c*). In this manner, the CAM blocks 511 previous to (e.g., above) the target CAM block 511 are not assigned CAM rows 512 from other CAM blocks 511, thereby retaining their original CAM row assignments and addresses. For some embodiments, the switching element (SW) includes a control terminal to receive a switch enable signal (EN_SW) that selectively enables and disables the spare switching element, as described above with respect to FIG. 6A. For other embodiments, each spare switching element can be disabled by de-asserting all of its corresponding routing controls signals, for example, so that the spare switching element does not connect the match signals lines of an associated CAM row to the PRS lines 152 of any routing block 581.

Thus, for the example of FIG. 8, the spare switching element SPSWA associated with the previous CAM block 511A is disabled so that CAM block 511A retains its original row assignments (e.g., rows 512A(1)-512A(8)).

Then, the spare switching elements in the PRS routing blocks 581 corresponding to the target CAM block 511 and all subsequent CAM blocks 511 (e.g., CAM blocks having greater row addresses than the target CAM block) are enabled (709*d*), and the first switching elements in the PRS routing blocks 581 corresponding to the subsequent CAM blocks 511 are disabled (709*e*). As a result, the first CAM row 512 in each CAM block 511 subsequent to the target CAM block 511 is re-assigned to the previous CAM block 511 by connecting its match signal lines to the spare switching element in the PRS routing block 581 associated with the previous CAM block, and by disconnecting its match signal lines from its originally associated switching element (e.g., in the PRS routing block 581 associated with its original CAM block 511). In this manner, a row from each CAM block subsequent to the target CAM block is re-assigned to the corresponding previous CAM block so that the defective CAM row is functionally replaced by a CAM row from the next CAM block, whose row lost to the target CAM block is functionally replaced by a CAM row from the next CAM block, and so on.

Thereafter, the defective row address mapping information (DA_MAP) is stored in the memory element 575 and provided to address control circuit 570. In response thereto, address control circuit 570 re-maps the address space of the non-defective CAM rows 512 and the enabled spare CAM row 514 of the CAM array to reflect the row re-assignments that allow each CAM block 511 to have its full 8 CAM rows 512. In this manner, if there is a defective CAM row, address circuit 570 can modify ADDR in response to DA_MAP to select the correct word line during read and write operations. For example, if CAM row 512A(8) is defective and is functionally replaced by CAM row 512B(1), then during a write operation addressing CAM row 512A(8), address control circuit 570 translates the input address of row 512A(8) to generate the re-assigned address for CAM row 512B(1).

Further, if the row selected to functionally replace the defective row is re-assigned to another CAM block, then it is functionally replaced by another CAM row, which in turn may be functionally replaced by another row, and so on. The defective address mapping information allows address circuit 570 to maintain a current address list of all active and non-defective CAM rows in the CAM array.

Referring again to the example of FIG. 8, the spare switching elements SPSWB and SPSWC associated with the target CAM block 511B and the subsequent CAM block 511C, respectively, are enabled, and the first switching element SWC1 associated with the first CAM row 512C(1) in the subsequent CAM block 511C (e.g., relative to the target CAM block 511B is enabled. In this manner, the MS lines of the first CAM row 512C(1) in the third CAM block 511C can be selectively connected to the MS lines of the CAM rows of the second CAM block 511B via the signal routing lines 152 in the second PRS routing block 581B via its spare switching element SPSWB, thereby re-assigning CAM row 512C(1) to the second CAM block 511B, as indicated by arrow 551. Similarly, the MS lines of the spare CAM row 514 can be selectively connected to the MS lines of the CAM rows of the third CAM block 511C via the signal routing lines 152 in the third PRS routing block 581C via its spare switching element SPSWC, thereby re-assigning the spare CAM row 514 to the third CAM block 511C, as indicated by arrow 552.

For the example of FIG. 8, DA_MAP information is provided to the address control circuit 570 to reflect the CAM row re-assignments resulting from the functional replacement of the defective CAM row 511B(8). For the above example, CAM block 511A does not have any defective rows, and thus it includes CAM rows 512A(1)-512A(8) having addresses 1-8, respectively. CAM block 511B has the defective row 512B(8) having row address 16, which is functionally replaced by CAM row 512C(1) having row address 17, and thus CAM block 511B is re-mapped to include CAM rows 512B(1)-512B(7) and 512C(1) having addresses 9-15 and 17, respectively. For CAM block 511C, its first row 512C(1) is re-assigned to CAM block 511B and is functionally replaced by spare CAM row 514 having row address 25. Thus, CAM block 511C includes spare CAM row 514 and CAM rows 512C(2)-512C(8) having addresses 25 and 18-24, respectively. For this example, the defective address mapping information can cause address control circuit 570 to map read and write addresses intended for rows addresses 9-16 of the second CAM block 511B to row addresses 9-15 and 17, and can cause address control circuit 570 to map read and write addresses intended for rows addresses 17-24 of the third CAM block 511C to row addresses 25 and 18-24, respectively.

Thus, in accordance with present embodiments, address control circuit 570 can re-direct read and write operations intended for the defective and all subsequent CAM rows to their corresponding re-mapped CAM rows in a manner that is transparent to users. For the above example, if a user desires to store a sub-expression of a regular expression in CAM block 511B, address control circuit 570 can cause data intended for storage in CAM rows 512B(1)-512B(7) to be stored therein, and can cause data intended for storage in CAM row 512B(8) to be stored in CAM row 512C(1), thereby re-mapping CAM row 512B(8) to CAM row 512C(1). Similarly, if a user desires to store another sub-expression in CAM block 511C, address circuit 570 can cause data intended for storage in CAM rows 512C(2)-512C(8) to be stored therein, and can cause data intended for storage in CAM row 512C(1) to be stored in spare CAM row 514, thereby re-mapping CAM row 512C(1) to spare CAM row 514.

Of course, for other embodiments, address control circuit 570 can employ other suitable row address mapping schemes that re-map the entire address space of a CAM block 511 having one of its rows re-assigned to another CAM block to maintain the relationship between the relative physical location of the rows and their addresses. Thus, in another embodiment, instead of mapping the address CAM row 512C(1) to spare CAM row 514 and leaving the addresses of its other (e.g., not re-assigned) CAM rows 512C(2)-512(8) unaltered, address circuit 570 can be configured to shift the entire address space of CAM block 511C so that the addresses of the CAM rows in CAM block 511C are mapped to their corresponding next CAM rows (including the spare row 514). For example, address circuit 570 can be configured to map the address of row 512C(1) to row 512C(2), to map the address of row 512C(2) to row 512C(3), and so on, where the address of row 512C(8) is mapped to spare row 514.

As described above, row redundancy techniques according to present embodiments allow a defective CAM row in an identified CAM block to be functionally replaced by rippling a non-defective CAM row through the array from the spare CAM row to the identified CAM row. More specifically, the defective CAM row is functionally replaced by disabling the defective CAM row and re-assigning a CAM row from a subsequent CAM block to the identified CAM block. The CAM row re-assigned to the identified CAM block is functionally replaced by re-assigning a CAM row from the next subsequent CAM block, and so on, where the spare CAM row is enabled and assigned to functionally replace the CAM row re-assigned from the last CAM block.

Advantageously, the defective CAM row 512 in a given CAM block 511(x) can be functionally replaced by a CAM row 512 in the next adjacent CAM block 511(x+1) using the PRS routing block 581 associated with the given CAM block 511(x), thereby eliminating the need for PRS routing lines extending across the entire CAM array between the spare CAM row and all main CAM rows to re-route match signals associated with the defective CAM row to the spare CAM row. Accordingly, in contrast to conventional row redundancy techniques that re-map a defective CAM row directly to a spare CAM row, row redundancy techniques in accordance with the present embodiments sequentially ripple non-defective CAM rows through the CAM array to functionally replace the defective CAM row without directly mapping the address of the defective CAM row to the spare CAM row. As described above, this is especially advantageous in a PRS-equipped CAM array in which the match signals of each CAM row can be selectively routed to any number of other arbitrarily selected CAM rows at the same time by the PRS to implement regular expressions because re-routing the match signals associated with a defective CAM row to a spare CAM row located many row away (e.g., at the top or the bottom of the array) the CAM array can consume a significant amount of the PRS' resources, thereby undesirably reducing the amount of the PRS' resources available for interconnecting the CAM rows to implement regular expression search operations.

Note that the exemplary embodiment of FIG. 5B includes only one column of PRS routing blocks 581A-581C, each extending across the CAM rows 512 of an associated one of CAM blocks 511A-511C, respectively. As described above with respect to FIG. 4B, embodiments of the PRS 580 can include multiple columns of signal routing lines 152 that are offset with respect to one another to provide a more flexible routing structure than a PRS that does not have staggered routing lines. Accordingly, for other embodiments of FIG. 5B, the PRS 580 can include multiple columns of PRS routing blocks 581 having signal routing lines 152 that are offset with respect to one another.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) that may be used to transfer such formatted data and/or instructions through wireless, optical, or wired signaling media or any combination thereof. Examples of transfers of such formatted data and/or instructions include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs. These computer programs may include, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

What is claimed is:

1. A content addressable memory (CAM) device, comprising:
    an array having a number N of CAM rows, each row including a plurality of CAM cells coupled to a match line;
    a spare CAM row including a plurality of CAM cells coupled to a spare match line; and
    row replacement circuitry configured to functionally replace a defective CAM row and each subsequent CAM row in the array with corresponding next adjacent CAM rows, wherein a last CAM row in the array is functionally replaced by the spare CAM row, wherein the row replacement circuitry comprises:
    a programmable interconnect routing structure (PRS) coupled to the CAM rows and the spare CAM row, the PRS configured to selectively route a match signal from any CAM row as an input match signal to any number of arbitrarily selected CAM rows or spare CAM row at the same time.

2. The CAM device of claim 1, wherein the PRS comprises inputs coupled to the match lines and to the spare match line.

3. The CAM device of claim 1, wherein the PRS functionally replaces the defective CAM row with the next adjacent CAM row by re-routing match signals associated with the defective CAM row to the next adjacent CAM row.

4. The CAM device of claim 1, wherein the PRS disables the defective CAM row by disconnecting the defective CAM row from the PRS.

5. The CAM device of claim 1, wherein the PRS re-routes match signals associated with each CAM row positioned below the defective CAM row to the corresponding next adjacent CAM row, and re-routes the match signals associated with last CAM row in the array to the spare CAM row.

6. The CAM device of claim 1, wherein the PRS includes at least one column comprising:
    a state signal line; and
    a number N of first switching elements, each selectively connecting the state signal line to a corresponding CAM row; and
    a second switching element selectively connecting the state signal line to the spare CAM row.

7. A content addressable memory (CAM) device, comprising:
    an array having at least one CAM block including a number N of CAM rows, each row including a plurality of CAM cells coupled to a match line;
    a spare CAM row including a number of CAM cells coupled to a spare match lines; and
    a programmable interconnect routing structure (PRS) coupled to the CAM rows and configured to selectively route a match signal output from any CAM row to any number of other arbitrarily selected CAM rows at the same time, and further configured to functionally replace a defective CAM row with another CAM row in the array.

8. The CAM device of claim 7, wherein the PRS is configured to functionally replace the defective CAM row with a next adjacent CAM row in the array.

9. The CAM device of claim 8, wherein the PRS disables the defective CAM row by disconnecting the defective CAM row from the PRS.

10. The CAM device of claim 8, wherein the PRS is further configured to functionally replace each CAM row in the array positioned below the defective CAM row with the corresponding next adjacent CAM row in the array, and to functionally replace the last CAM row in the array with the spare CAM row.

11. The CAM device of claim 10, wherein the PRS functionally replaces the defective CAM row with the next adjacent CAM row by re-routing match signals associated with the defective CAM row to the next adjacent CAM row.

12. The CAM device of claim 7, wherein the PRS includes at least one column comprising:
- a state signal line; and
- a number N of first switching elements, each selectively connecting the state signal line to a corresponding CAM row; and
- a second switching element selectively connecting the state signal line to the spare CAM row.

13. A content addressable memory (CAM) device, comprising:
- a plurality of CAM blocks, each CAM block including a number N of CAM rows, and each CAM row including a plurality of CAM cells coupled to a match line;
- a spare CAM row including a number of CAM cells coupled to a spare match lines; and
- a programmable interconnect routing structure (PRS) coupled to the CAM rows and configured to functionally replace a defective CAM row with another CAM row in the array, wherein the PRS is configured to functionally replace the defective CAM row in a first CAM block with a selected CAM row in a next adjacent CAM block.

14. The CAM device of claim 13, wherein the PRS is configured to functionally replace a selected CAM row in a last CAM block with the spare CAM row.

15. The CAM device of claim 13, wherein the PRS functionally replaces the defective CAM row with the selected CAM row in the next adjacent CAM block by re-routing match signals associated with the defective CAM row to the next adjacent CAM block.

16. The CAM device of claim 13, wherein the PRS disables the defective CAM row by disconnecting the defective CAM row from the PRS.

17. The CAM device of claim 13, wherein the spare row is positioned after the last CAM row in the last CAM block.

18. The CAM device of claim 13, wherein the PRS includes a plurality of columns of collinear state signal routing lines, wherein a first column includes a set of state signal lines each having a height of N CAM rows.

19. The CAM device of claim 18, wherein each set of state signal lines lying within the first column and extending across all the CAM blocks in the corresponding array includes N+1 switching elements.

* * * * *